(12) United States Patent
Ando et al.

(10) Patent No.: US 8,354,975 B2
(45) Date of Patent: Jan. 15, 2013

(54) ELECTROMAGNETIC BAND GAP ELEMENT, AND ANTENNA AND FILTER USING THE SAME

(75) Inventors: Noriaki Ando, Tokyo (JP); Tsuneo Tsukagoshi, Tokyo (JP); Koichi Takemura, Tokyo (JP)

(73) Assignee: NEC Corporation, Tokyo (JP)

( * ) Notice: Subject to any disclaimer, the term of this patent is extended or adjusted under 35 U.S.C. 154(b) by 324 days.

(21) Appl. No.: 12/810,094

(22) PCT Filed: Dec. 26, 2008

(86) PCT No.: PCT/JP2008/073738
§ 371 (c)(1),
(2), (4) Date: Jun. 22, 2010

(87) PCT Pub. No.: WO2009/082003
PCT Pub. Date: Jul. 2, 2009

(65) Prior Publication Data
US 2010/0265159 A1 Oct. 21, 2010

(30) Foreign Application Priority Data
Dec. 26, 2007 (JP) .................. 2007-334261

(51) Int. Cl.
*H01Q 15/14* (2006.01)
(52) U.S. Cl. .................. 343/913; 343/756; 333/202
(58) Field of Classification Search .................. 343/756, 343/907, 912, 913; 333/134, 202
See application file for complete search history.

(56) References Cited

U.S. PATENT DOCUMENTS

| | | | |
|---|---|---|---|
| 6,175,337 B1 * | 1/2001 | Jasper et al. | 343/770 |
| 6,262,495 B1 | 7/2001 | Yablonovitch et al. | |
| 6,476,771 B1 * | 11/2002 | McKinzie, III | 343/756 |
| 6,483,481 B1 | 11/2002 | Sievenpiper et al. | |
| 6,525,695 B2 | 2/2003 | McKinzie, III | |
| 6,897,831 B2 | 5/2005 | McKinzie, III et al. | |
| 6,933,895 B2 | 8/2005 | Mendolia et al. | |
| 7,151,507 B1 | 12/2006 | Herting | |
| 2002/0167456 A1 | 11/2002 | McKinzie | |
| 2002/0167457 A1 | 11/2002 | McKinzie, et al. | |
| 2003/0052757 A1 | 3/2003 | McKinzie, III et al. | |
| 2003/0112186 A1 | 6/2003 | Sanchez | |
| 2004/0263408 A1 | 12/2004 | Sievenpiper et al. | |
| 2005/0029632 A1 * | 2/2005 | McKinzie et al. | 257/665 |

(Continued)

FOREIGN PATENT DOCUMENTS

JP 2002510886 A 4/2002

(Continued)

OTHER PUBLICATIONS

International Search Report for PCT/JP2008/073738 mailed Mar. 24, 2009.

(Continued)

*Primary Examiner* — Don Le

(57) ABSTRACT

Conductor pieces 102 that are periodically arrayed, a conductor plane 103 that has openings 104 periodically arrayed so as to correspond to the conductor pieces 102, and a dielectric 108 that is arranged between the conductor pieces 102 and the conductor plane 103, are included. Island electrodes 105 and planar inductance elements 106 are arranged in the openings 104 of the conductor plane 103. The island electrodes 105 and the conductor pieces 102 are connected by conductor posts 107. The island electrodes 105 and the conductor plane 103 are connected through the planar inductance elements 106.

18 Claims, 22 Drawing Sheets

U.S. PATENT DOCUMENTS

2007/0182639 A1   8/2007   Sievenpiper
2011/0134010 A1*  6/2011   Toyao et al. .................. 343/844

FOREIGN PATENT DOCUMENTS

| | | | |
|---|---|---|---|
| JP | 2003527018 A | 9/2003 |
| JP | 2003529259 A | 9/2003 |
| JP | 2004022587 A | 1/2004 |
| JP | 2004311734 A | 11/2004 |
| JP | 2005538629 A | 12/2005 |
| JP | 2006253929 A | 9/2006 |
| JP | 2006302986 A | 11/2006 |
| JP | 2008035424 A | 2/2008 |
| WO | 2005091941 A | 10/2005 |
| WO | 2006086213 A | 8/2006 |

OTHER PUBLICATIONS

C. Mias et al, "A Varactor-Tunable High Impedance Surface With a Resistive-Lumped-Element Biasing Grid", IEEE Transactions on Antennas and Propagation, vol. 55 No. 7, Jul. 2007, pp. 1955-1962.
Japanese Office Action for JP2009-547140 mailed on Aug. 23, 2012.

* cited by examiner

FIG. 5
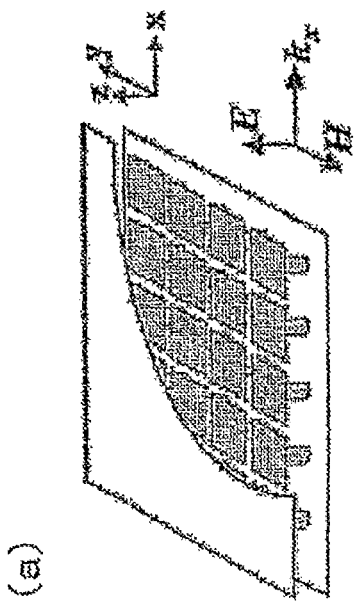
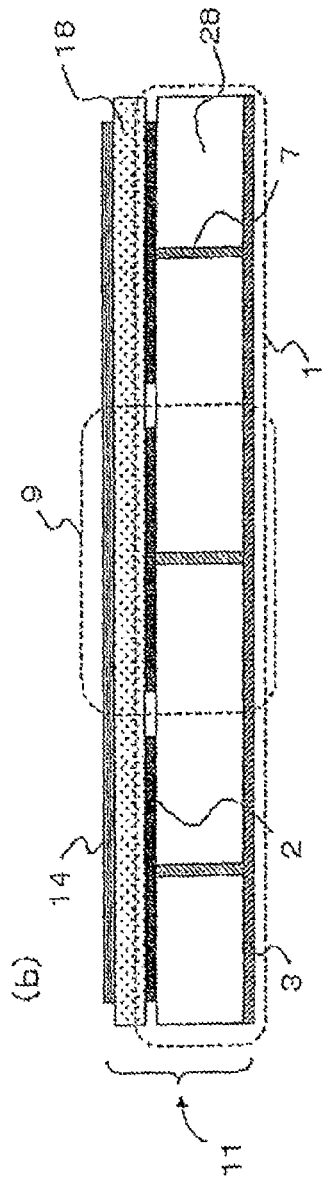
FIG. 6
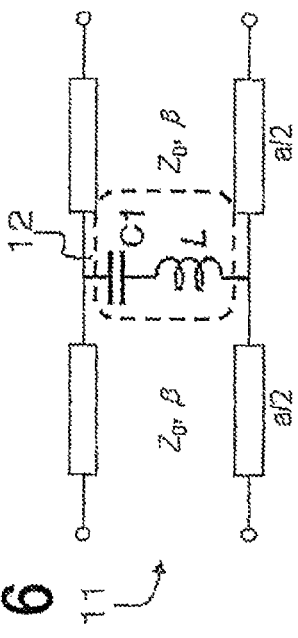

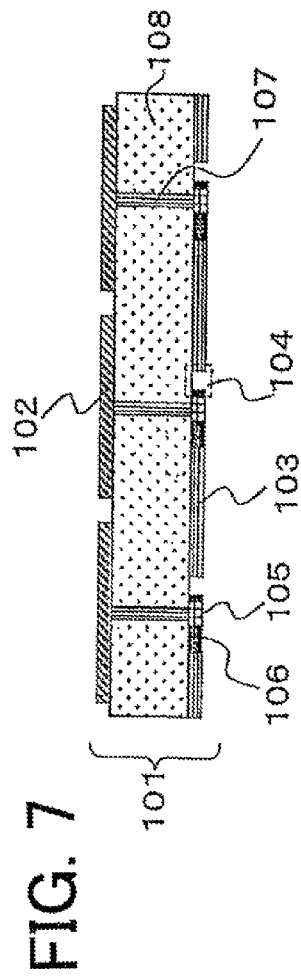
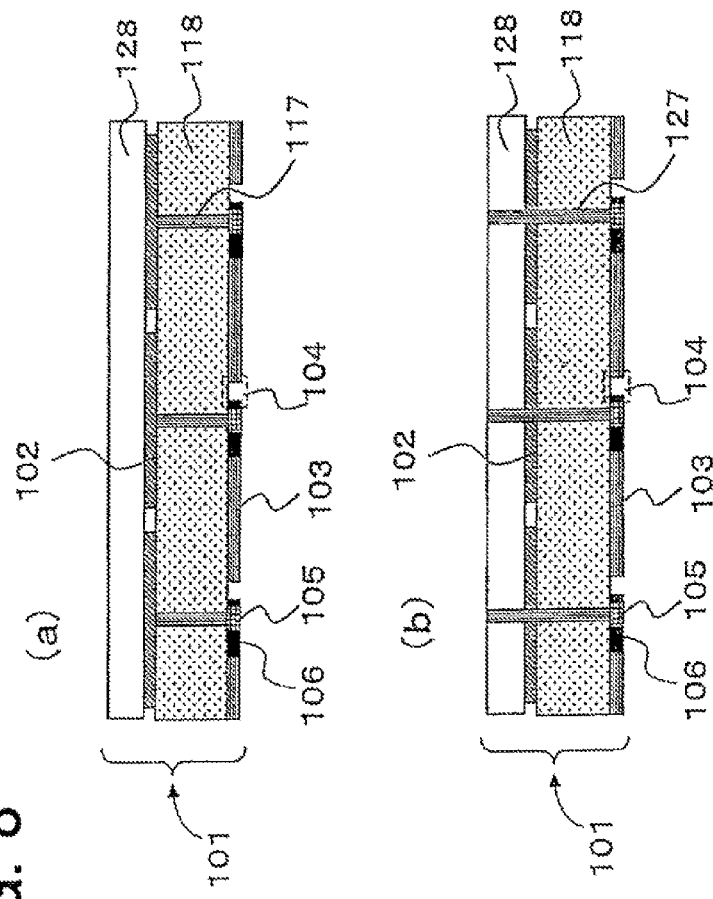
FIG. 7
FIG. 8

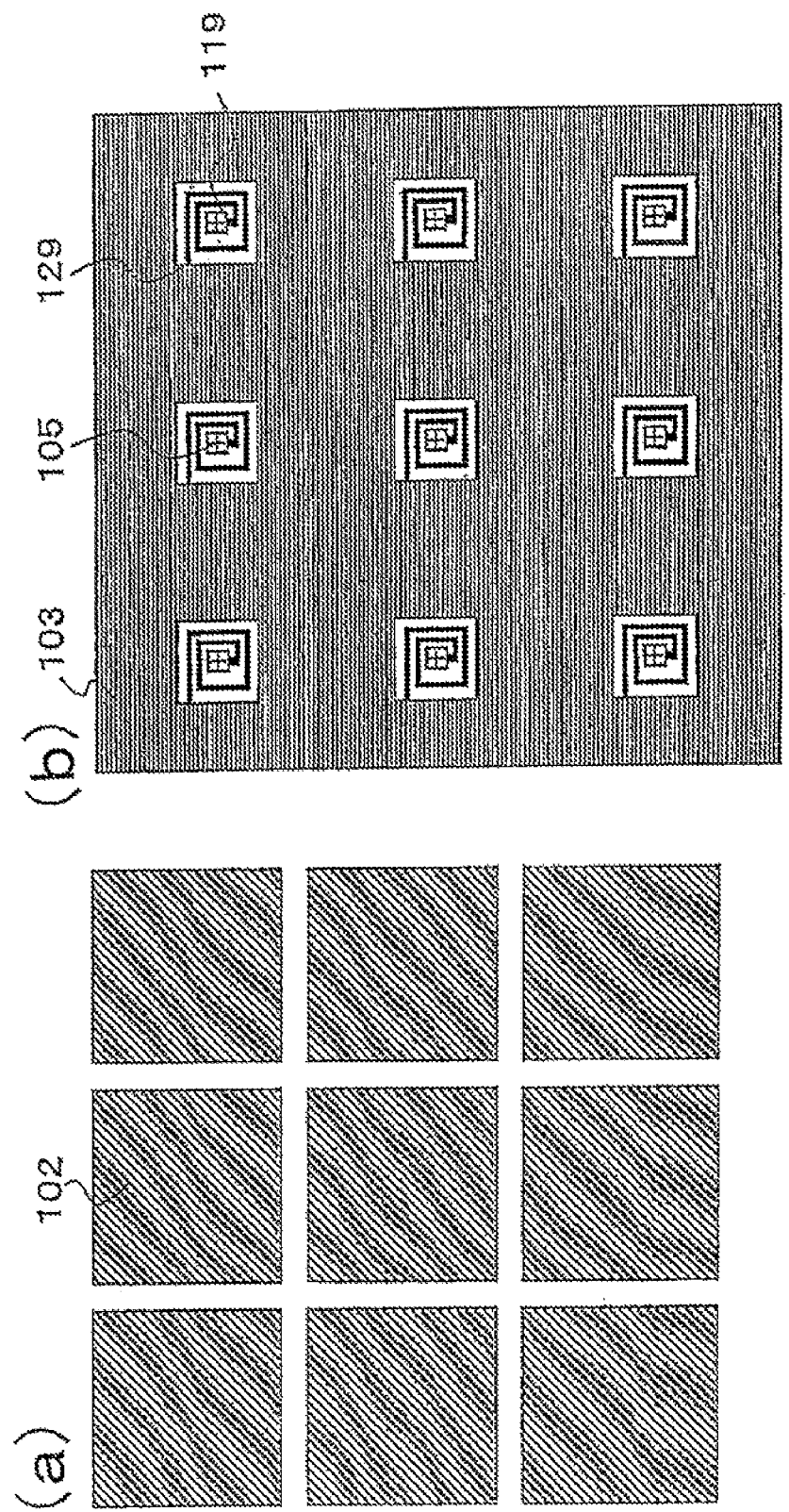

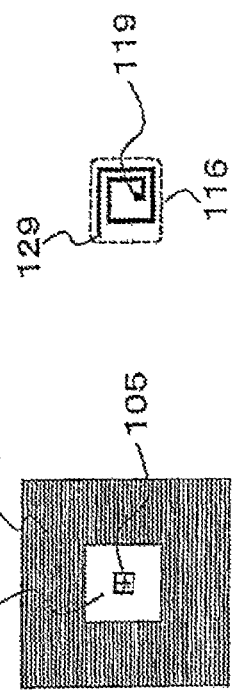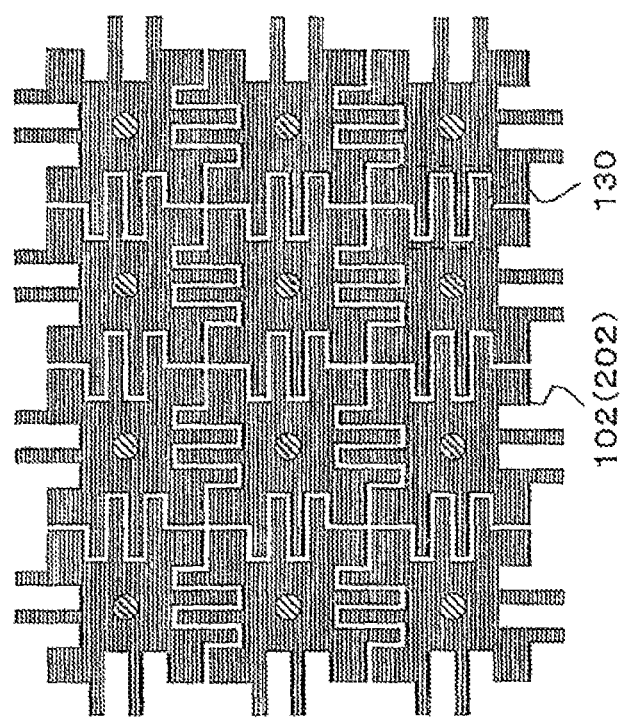

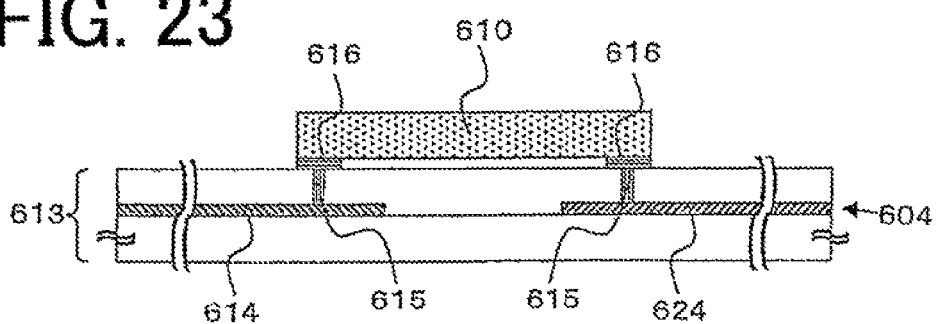
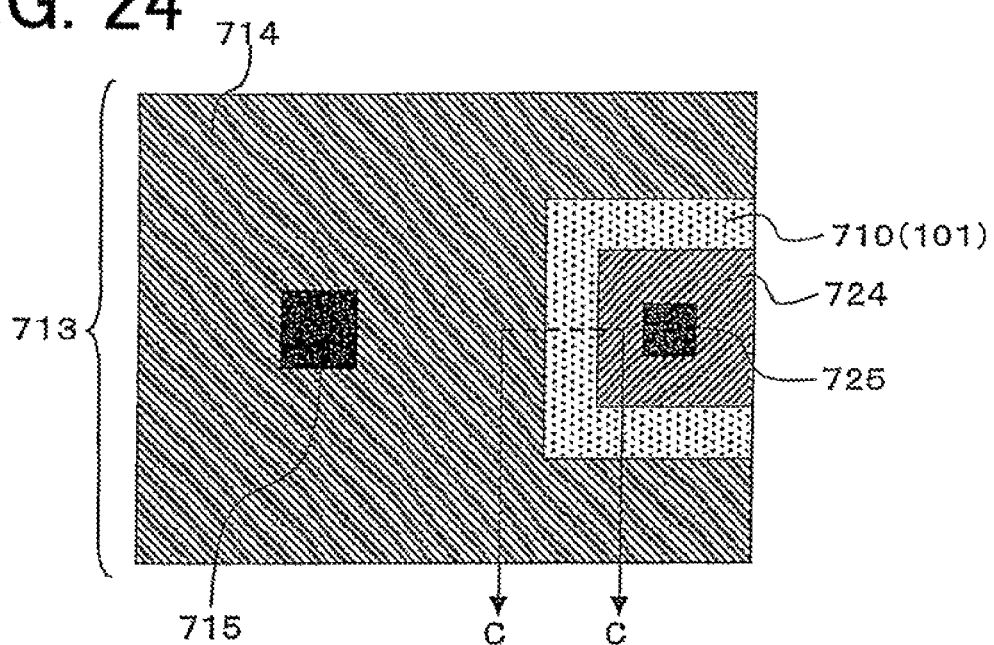
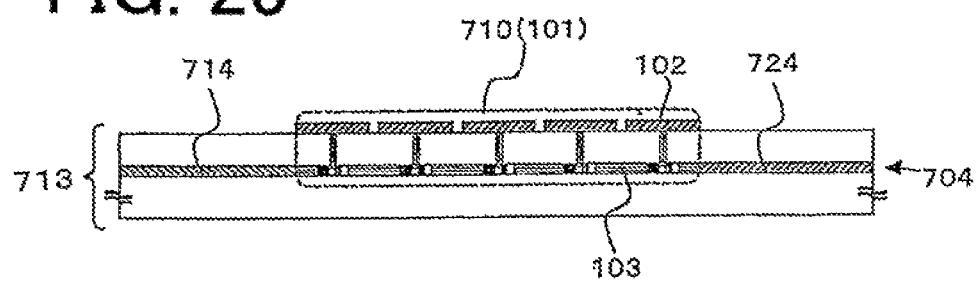

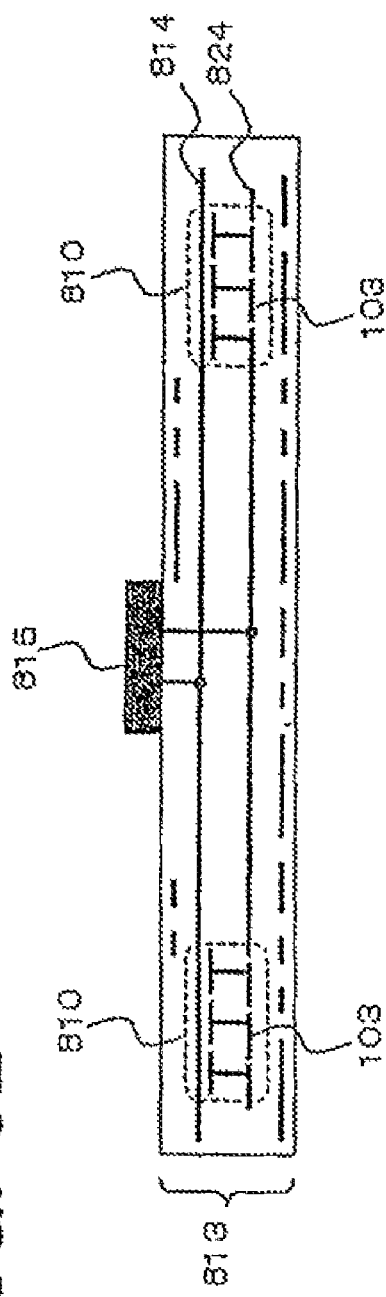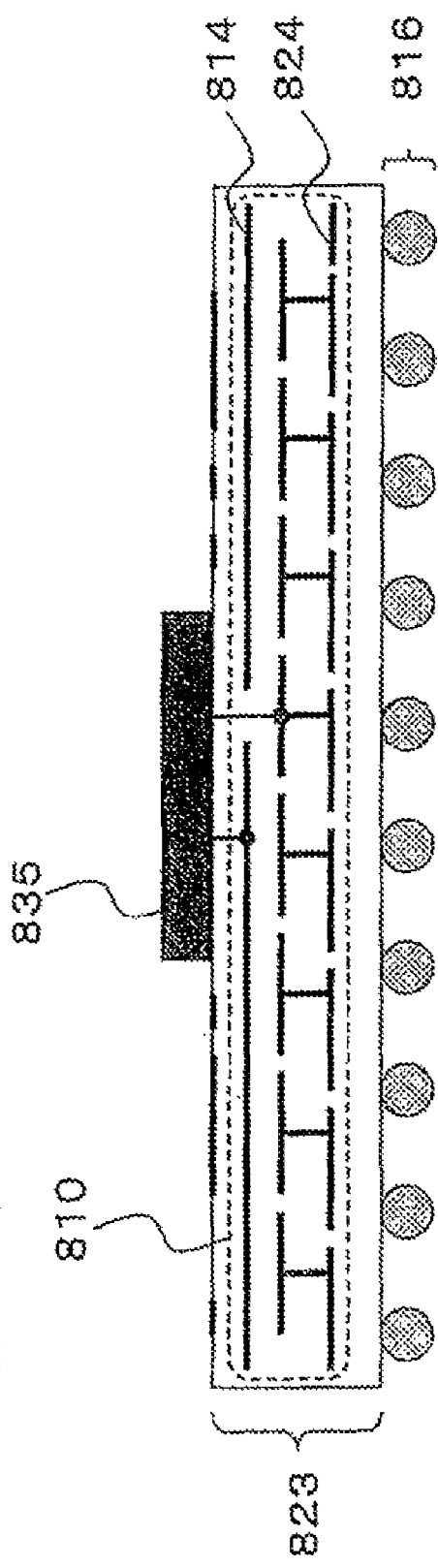

ELECTROMAGNETIC BAND GAP ELEMENT, AND ANTENNA AND FILTER USING THE SAME

TECHNICAL FIELD

The present invention relates to an electromagnetic band gap device that can suppress propagation of surface waves and allows in-phase reflection and the like of electromagnetic waves in a certain frequency band, and an antenna and a filter using the same. In particular, the invention relates to a high impedance surface which is a configuration of an EBG structure.

BACKGROUND ART

With the recent advancements in technology, there has been developed an electromagnetic band gap (hereinafter, referred to as EBG) structure. The EBG structure has been proposed, for example, as a means for preventing electromagnetic interference between circuits due to unwanted electromagnetic radiation from a high frequency circuit. In a broad sense, the EBG structure refers to a two- or three-dimensional periodic structure of dielectrics or conductors that suppresses or greatly attenuates two- or three-dimensional propagation of electromagnetic waves in a certain frequency band.

As configuration of the EBG structure, a high impedance surface (hereinafter, referred to as HIS) is disclosed in PTL 1 and others. Important characteristics include the suppression of surface waves (surface current) and the in-phase reflection of electromagnetic waves.

FIG. 1 illustrates a device that has a conventional HIS structure. FIG. 1(a) shows the sectional view of the HIS shown in FIG. 2a of PTL 1. FIG. 1(b) shows the top view of the HIS shown in FIG. 2b of PTL 1. FIG. 1(c) shows the top view of the HIS shown in FIG. 3a of PTL 2.

As shown in FIG. 1(a), the HIS 1 has the structure that conductor elements 4 of thumbtack shape each composed of a conductor piece 2 and a conductor post 7 are periodically arranged on a conductor plane 3. Each conductor element 4 is electrically connected to the conductor plane 3. The shapes of the conductor pieces 2 proposed include a regular hexagonal shape as shown in FIG. 1(b) and a square shape as shown in FIG. 1(c).

FIG. 2 shows an equivalent circuit diagram of the conventional HIS shown in FIG. 1 of PTL 1. The HIS of FIGS. 1(a) to 1(c) can be considered as a distributed constant circuit that includes a two-dimensional array of series capacitances C between adjoining thumbtack conductors and parallel inductances L each formed by two thumbtack conductors and the conductor plane as shown in FIG. 2.

The parallel inductances L are mostly formed by the conductor posts 7, and their value depends on the length of the conductor posts 7. In the meantime, the series capacitances C are formed between adjoining conductor pieces, and their value depend on the distance between the adjoining conductor pieces and the size of the conductor pieces. It is described in PTL 1 that the HIS provides high impedance to suppress the propagation of surface currents in the vicinity of the resonant frequency of the resonant circuit that is composed of the parallel inductance L and the series capacitance C. PTL 1 also describes that the propagation-suppressed bandwidth (band gap bandwidth) is proportional to the reciprocal of the series capacitance C.

With the product of the series capacitance C and the parallel inductance L unchanged in value as shown in FIG. 2, the conductor pieces 2 can be made smaller to reduce the area occupied by the HIS without changing the center frequency of the band gap.

Since the band gap bandwidth is proportional to the reciprocal of the series capacitance C, the parallel inductance L can be increased to widen the band gap bandwidth while maintaining the product of the series capacitance C and the parallel inductance L unchanged in value.

Several methods have been proposed to increase the parallel inductance L. For example, according to the methods shown in FIG. 13 of PTL 3 and FIG. 17 of PTL 4, the dielectric plate between the conductor pieces 2 and the conductor plane 3 are formed in a two-layer structure as shown in FIG. 3(a) (a first dielectric plate 18 and a second dielectric plate 28). Inductance elements 6 are formed on the lower, second dielectric plate 28. The conductor pieces 2 and the inductance elements 6 are connected by first conductor posts 17. The inductance elements 6 and the conductor plane 3 are electrically connected by second conductor posts 27.

FIG. 3(b) is an equivalent circuit diagram of the structure shown in FIG. 3(a). As is evident from FIG. 3(b), the insertion of the inductance elements 6 increases the parallel inductances L. Examples of the inductance elements 6 include spiral coils 16 shown in FIG. 4(a) and meander coils 26 shown in FIG. 4(b), as well as surface acoustic wave resonators and bulk acoustic wave resonators.

There are known examples of application of the EBG structure. For example, PTL 1 describes that the EBG structure is used as the reflector of an antenna that employs a frequency band within the band gap frequency band of the EBG structure. It is described that such use prevents the propagation of surface waves through the EBG structure, whereby backside emission is suppressed to avoid degradation of antenna characteristics.

It is described that when the EBG structure is used as the reflector of an inverted L antenna in particular, the in-phase reflection of electromagnetic waves on the EBG structure can be utilized to improve radiation efficiency aside from the suppression of surface waves. In addition, the antenna element can be located close to the reflector surface, so that the antenna can be reduced in thickness.

In PTL 3, the EBG structure is used for a grounding cabinet in order to prevent interference between two antennas through surface currents. In PTL 5, the EBG structure is used on a part of a cabinet's inner wall. If various functions are integrated into a high frequency circuit in a cabinet, unwanted electromagnetic radiation occurring in the cabinet can cause electromagnetic interference between the signals of the respective functions and the problem of adverse effects on the characteristics of the entire high frequency circuit.

The use of the EBG structure for the cabinet inner wall that is opposed to the high frequency circuit prevents unwanted electromagnetic radiation in the cabinet. The cabinet inner wall can be brought close to the high frequency circuit with no change in the characteristics of the high frequency circuit, which allows miniaturization of the cabinet.

Moreover, it is known from PTL 6 that the foregoing EBG structure can be used to form a parallel-plate waveguide type EBG structure. A parallel-plate waveguide type EBG device refers to a structure that suppresses the propagation of electromagnetic waves in a parallel-plate waveguide across a certain bandwidth. FIG. 5 shows the parallel-plate waveguide type EBG structure 11 described in PTL 6.

The parallel-plate waveguide type EBG structure 11 includes a first conductor plane 14 and the HIS 1 shown in FIG. 1. The first conductor plane 14 and the HIS 1 are electrically insulated from each other. The periodic array of conductor pieces 2 in the HIS 1 is located in a conductor layer between the first conductor plane 14 and the conductor plane 3 of the HIS 1. The conductor pieces 2 and the conductor plane 3 are electrically connected by respective conductor posts 7.

The parallel-plate waveguide type EBG structure 11 can be considered as a periodic structure of a unit cell 9 which is the component unit.

PTL 6 discloses that if the first conductor plane 14 and the conductor pieces 2 of the HIS 1 are adjacent to each other, the equivalent circuit of the parallel-plate waveguide type EBG structure 11 per unit cell 9 is as shown in FIG. 6, such that the transmission lines are shunted by a series resonant circuit 12 in the center. In FIG. 6, the capacitance C1 represents the capacitance formed between the conductor piece 2 and the first conductor plane 14. The inductance L represents the inductance formed by the conductor post 7 between the conductor piece 2 and the conductor plane 3.

Unlike the HIS 1, the equivalent circuit of FIG. 6 includes no series capacitance C between the thumbtack conductors. The reason is that the adjacency of the first conductor plane 14 and the conductor pieces 2 of the HIS 1 makes the capacitances C1 between the first conductor plane 14 and the conductor pieces 2 dominant over the series capacitances C between the adjoining thumbtack conductors, so that the series capacitances C between the adjoining thumbtack conductors become negligible.

It is described in PTL 6 and others that the parallel-plate waveguide type EBG structure 11 has a band gap frequency band in the vicinity of the resonant frequency of the series resonant circuit 12 shown in FIG. 6. It is also described that the size of the unit cell 9 can be reduced to increase the resonant frequency of the series resonant circuit 12, whereby the stop band is shifted to higher frequencies.

This means that when there is provided the first conductor plane 14 and the distance between the conductor pieces 2 and the first conductor plane 14 is adjusted, it is possible to create a band gap in other than the band gap frequency band of the HIS 1 itself.

Unlike the HIS 1, it is described in PTL 7 and others that the band gap will not be narrowed even if the series capacitance C is increased.

The parallel-plate waveguide type EBG structure 11 can be used, for example, to form the power supply and ground planes of a printed-circuit board (PCB) in electronic equipment, whereby power supply noise associated with the switching operations of active devices mounted on the PCB can be suppressed.

{Citation List}
{Patent Literature}
  {PTL 1} U.S. Pat. No. 6,262,495 B1 (FIG. 1, FIG. 2a, FIG. 2b)
  {PTL 2} U.S. Pat. No. 6,483,481 B1 (FIG. 2a, FIG. 3a)
  {PTL 3} U.S. Pat. No. 6,933,895 B2 (FIG. 13)
  {PTL 4} JP-A-2006-253929 (FIG. 1)
  {PTL 5} JP-A-2004-22587 (FIG. 1)
  {PTL 6} U.S. 2005/0029632 A 1 (FIGS. 1, 2, 4)

SUMMARY OF INVENTION

Technical Problem

The HIS 1 shown in FIG. 2 of PTL 1 has a band gap in the vicinity of the resonant frequency of the resonant circuit that is composed of the parallel inductance L and the series capacitance C. The band gap bandwidth is proportional to the reciprocal of the series capacitance C. With the product of the series capacitance C and the parallel inductance L which are unchanged in value, the parallel inductance L is thus increased to widen the band gap bandwidth.

The conductor posts 7 of the HIS 1 can be made longer to increase the parallel inductance L. The conductor pieces 2 can be made greater to increase the series capacitance C. To widen the band gap bandwidth in the structure of the HIS 1, it is therefore necessary to increase the conductor posts 7 in length, which produces the problem that the HIS 1 becomes accordingly thicker.

To reduce the HIS 1 in thickness and provide a band gap at a certain frequency as well, the series capacitance C needs to be increased because the parallel inductance L decreases as much as the conductor posts 7 are reduced in length. There has thus been the problem that the conductor pieces 2 become accordingly greater in size.

Now, in the case of the parallel-plate waveguide type EBG structure 11 shown in FIG. 1 of PTL 6, a band gap appears in the vicinity of the resonant frequency of the series resonant circuit that is composed of the inductance L and the capacitance C1. The capacitance C1 is proportional to the area of the conductor piece 2. Miniaturization of the unit cell decreases the area of the conductor piece 2, and thus the capacitance C1. In such a case, it is needed to suppress the decrease of the capacitance C1 by increasing the permittivity of the dielectric plate between the conductor pieces and the upper conductor plane or by reducing the thickness of the dielectric plate, or to increase the inductance L by making the conductor posts 7 longer.

The use of an expensive dielectric plate made of a high permittivity material or an expensive dielectric plate having a small thickness has the problem of increased manufacturing cost.

The longer conductor posts 7 have the problem that the parallel-plate waveguide type EBG structure 11 becomes accordingly thicker.

An exemplary object of the present invention is to provide an electromagnetic band gap device that can be reduced in size and thickness, and can be increased in the band gap bandwidth, and an antenna and a filter using the same.

Solution to Problem

An exemplary electromagnetic band gap device according to the present invention includes: conductor pieces that are periodically arrayed; a conductor plane that has openings periodically arrayed so as to correspond to the conductor pieces; island electrodes that are arranged in the openings; and inductance elements. The conductor pieces and the island electrodes are electrically connected by conductor posts. The island electrodes and the conductor plane are electrically connected through the inductance elements.

An exemplary antenna according to the present invention includes the electromagnetic band gap device as a reflector. A use frequency band of the antenna falls within a band gap frequency band of the electromagnetic band gap device.

An exemplary common mode filter according to the present invention includes the electromagnetic band gap device.

An exemplary parallel-plate waveguide type electromagnetic band gap device according to the present invention includes the electromagnetic band gap device and a first conductor plane. The periodic array of conductor pieces 2 in the electromagnetic band gap device and the first conductor plane are opposed to each other.

An exemplary power supply noise suppression filter according to the present invention includes parallel plates composed of first and second conductor planes, all or part of which are made of the parallel-plate waveguide type electromagnetic band gap device. Either one of the first and second conductor planes is connected to a power supply. The other is grounded.

This application is the National Phase of PCT/JP2008/073738, filed Dec. 26, 2008, which is based upon and claims the benefit of priority from prior Japanese Patent Application No. 2007-334261, filed 26 Dec. 2007. The contents of Japanese Patent Application No. 2007-334261 will be incorporated in the contents of description of this application.

Advantageous Effects of Invention

According to the present invention, the conductor pieces and the conductor plane are connected through parallel type inductances, whereby the parallel inductance can be increased. The electromagnetic band gap device can thus be reduced in size and thickness with an increase in the band gap bandwidth.

BRIEF DESCRIPTION OF DRAWINGS

FIG. 5 Diagrams showing the parallel-plate waveguide type EBG structure 11 described in PTL 6.

FIG. 6 An equivalent circuit diagram of the parallel-plate waveguide type EBG structure 11 of FIG. 6.

FIG. 7 A diagram showing a first embodiment of an EBG device according to the present invention.

FIG. 8 Sectional views showing an EBG structure in which a dielectric plate is arranged on the conductor pieces.

FIG. 9 Plan views showing the layout of the conductor pieces and conductor plane of FIG. 7.

FIG. 10 A plan view showing part of the layout of the conductor pieces and conductor plane of FIG. 7.

FIG. 11 A plan view showing an interdigital structure in which the sides of adjoining conductor pieces interdigitate with each other.

FIG. 23 A sectional view showing the cross section along the line B-B of FIG. 22.

FIG. 24 A plan view showing an example of a PCB that has a built-in common mode filter according to the present embodiment.

FIG. 25 A sectional view showing the cross section along the line C-C of FIG. 24.

FIG. 32 A sectional view showing another example of the PCB that has a built-in power supply noise suppression filter 810 which includes the EBG device of the present embodiment.

FIG. 33 A sectional view showing an example of a semiconductor package that has a built-in power supply noise suppression filter which includes the EBG device of the present embodiment.

DESCRIPTION OF EMBODIMENTS

Figure 1:
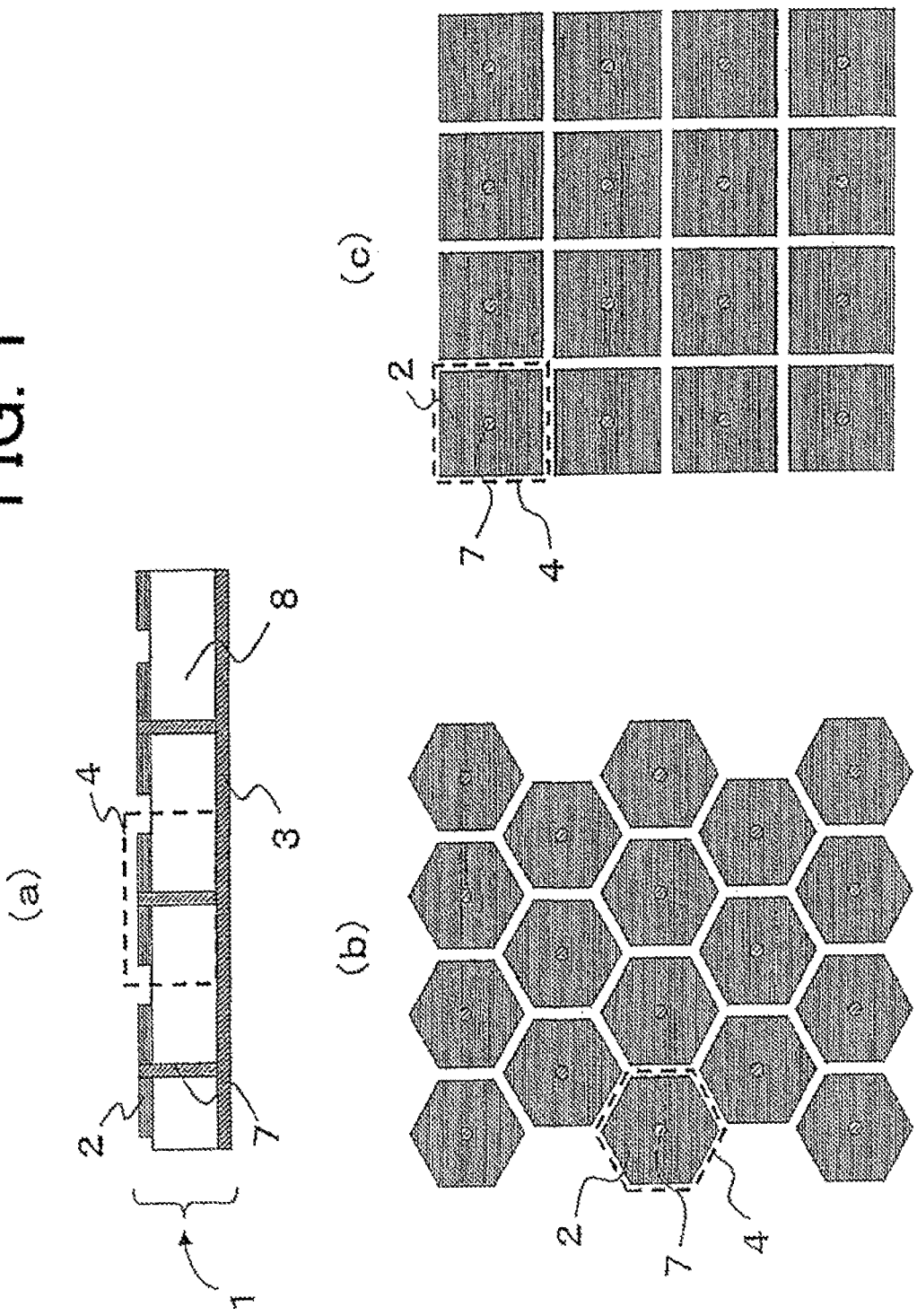
FIG. 1 Diagrams showing an HIS structure according to a conventional example.
Figure 2:
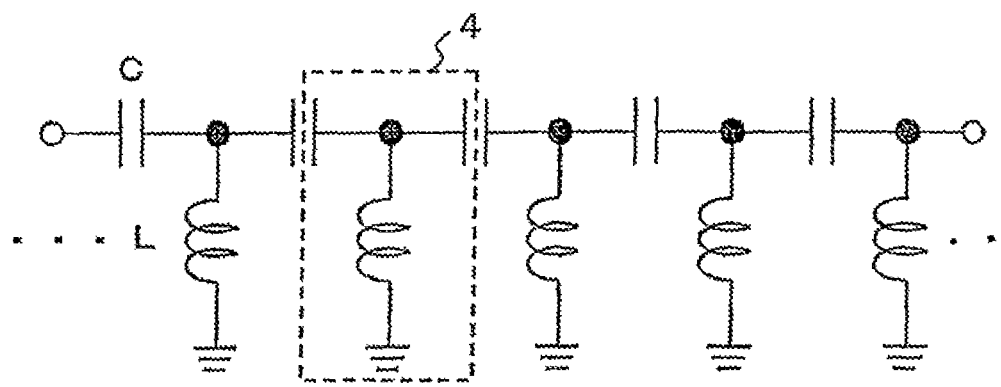
FIG. 2 An equivalent circuit diagram of the HIS according to the conventional example.
Figure 3:
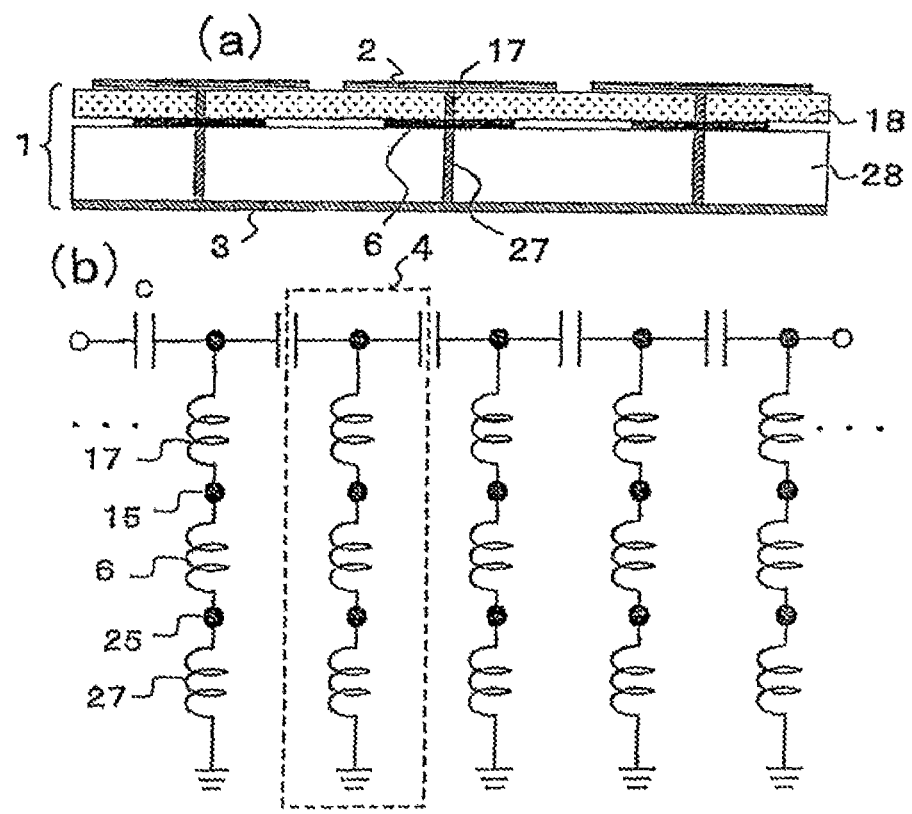
FIG. 3 Diagrams showing an example of an HIS that has inductance elements between conductor posts, and an equivalent circuit thereof.
Figure 4:
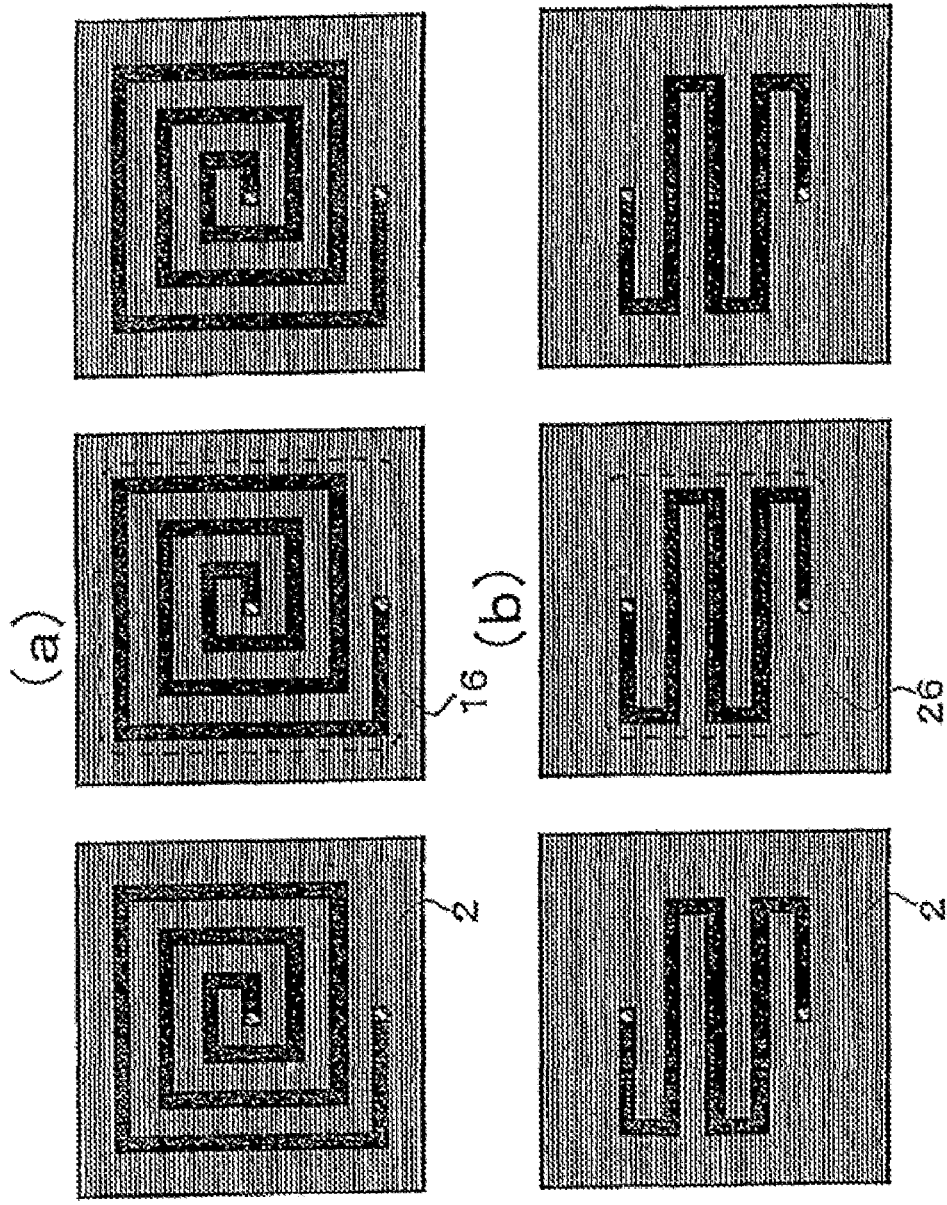
FIG. 4 Diagrams showing spiral coils and meander coils for use as inductance elements in the HIS.

Now, a best mode for carrying out the invention will be described in detail with reference to the drawings. Initially, an electromagnetic band gap (EBG) device according to the present invention will refer to one that can suppress the propagation of surface waves and allows the in-phase reflection of electromagnetic waves in a certain frequency band as mentioned above. The EBG device can be suitably used, for example, as a means for preventing electromagnetic interference between circuits due to unwanted electromagnetic radiations from a high frequency circuit.

First Embodiment

FIG. 7 shows a cross-sectional view of an electromagnetic band gap (EBG) device according to a first embodiment of the present invention. The EBG device 101 includes two conductor layers and a dielectric plate 108 that is sandwiched between the two conductor layers. The two conductor layers consist of a conductor layer that includes a periodic array of conductor pieces 102, and a conductor plane 103 that has openings 104 periodically formed. The openings 104 correspond to the periodic array of conductor pieces 102.

Island electrodes 105 and inductance elements 106 are arranged in the respective openings 104 of the conductor plane 103. The conductor plane 103, the planar inductance elements 106, and the island electrodes 105 are formed in the same conductor layer. The island electrodes 105 and the respective conductor pieces 102 are electrically connected by conductor posts 107.

The dielectric plate 108 is made of an epoxy resin substrate, a ceramic substrate, or the like, for example. Alternatively, the dielectric plate 108 need not be provided in particular (may be air). The planar inductance elements 106 are used as the inductance elements. The same holds for the subsequent other embodiments.

The conductor plane 103, the planar inductance elements 106, and the island electrodes 105 are formed as a continuous pattern of the same conductor layer, whereby the island electrodes 105 are electrically connected to the conductor plane 103 through the planar inductance elements 106, respectively.

The electrical connection of the conductor pieces 102 to the conductor plane 103 through the planar inductance elements 106 makes it possible to increase the parallel inductance L without increasing the distance from the conductor pieces 102 to the conductor plane 103. The EBG device 101 can thus be reduced in thickness.

The provision of the planar inductance elements 106 makes the parallel inductance higher than without the planar inductance elements 106. When setting the resonant frequency of the parallel inductance and the series capacitance to a certain value, it is therefore possible to suppress the series capacitance low.

The smaller the conductor pieces 102, the lower the series capacitance. The increased parallel inductance therefore allows miniaturization of the conductor pieces 102 and expansion of the band gap bandwidth as well.

While the conductor pieces 102 are formed at the uppermost layer in FIG. 7, a dielectric plate may be arranged on the conductor pieces 102. FIGS. 8(a) and 8(b) show sectional views of the EBG device 101 according to the first embodiment of the present invention when a dielectric plate is arranged on the conductor pieces 102. In FIGS. 8(a) and 8(b), a first dielectric plate 118 is arranged inside the EBG device 101. A second dielectric plate 128 is arranged on the conductor pieces 102. In such a case, non-through vias 117 shown in FIG. 8(a) may be formed as the conductor posts 107. Through vias 127 shown in FIG. 8(b) may be formed instead.

FIG. 9(a) is a plan view showing the layout of the conductor layer that constitutes the periodic array of conductor pieces 102 of the EBG device in FIG. 7. FIG. 9(b) is a plan view showing the layout of the conductor plane 103 of FIG. 7. FIG. 10 is an exploded view of each component of the conductor plane 103 in FIG. 9(b). Note that the sectional view of FIG. 7 does not show a partial cross section of FIG. 9(a), 9(b), or 10. While the spiral coil 116 of FIG. 10 serves as the inductance elements 106 of FIG. 7, the spiral coils 116 of FIGS. 9 and 10 do not have a cross section corresponding to the inductance elements 106 of FIG. 7. The small conductor pieces 102 of FIG. 9(a) and the conductor plane 103 and island electrodes 105 of FIG. 9(b) correspond to the small conductor pieces 102, the conductor plane 103, and the island electrodes 105 shown in FIG. 7, respectively, with the same sectional shapes.

FIG. 9(a) shows an example where conductor pieces 102 of square shape are periodically arrayed in a square lattice configuration. The conductor pieces 102, however, are not limited to the square layout of FIG. 9(a). The array of the conductor pieces 102 is not limited to the square lattice configuration, either. For example, as shown in FIG. 1(b), conductor pieces 102 of regular hexagonal shape may be arranged in a triangular lattice configuration.

As shown in FIG. 11, it is even possible to employ an interdigital structure where the sides of adjoining conductor pieces 102 interdigitate with each other in respective gap areas 130. Such a structure makes the opposed sides of the adjoining conductor pieces 102 greater in length, which can increase the series capacitance C. This makes it possible to reduce the conductor pieces 102 in size while maintaining the value of the series capacitance C, thereby allowing the miniaturization of the conductor pieces 102.

Meanwhile, the layer of the conductor plane 103 includes the planar inductance elements 106, which are made of the spiral coils 116 as shown in FIGS. 9(b) and 10, and the island electrodes 105 and the conductor plane 103 which are formed as a continuous pattern of the same conductor layer. A first terminal 119, one of two terminals of each planar inductance element 106, is continuous with an island electrode 105. A second terminal 129, the other terminal of the planar inductance element 106, is continuous with the conductor plane 103.

The formation of the conductor plane 103, planar inductance elements 106, and island electrodes 105 in the same conductor layer by patterning can reduce the number of conductor layers for suppressed manufacturing cost.

Figure 12:
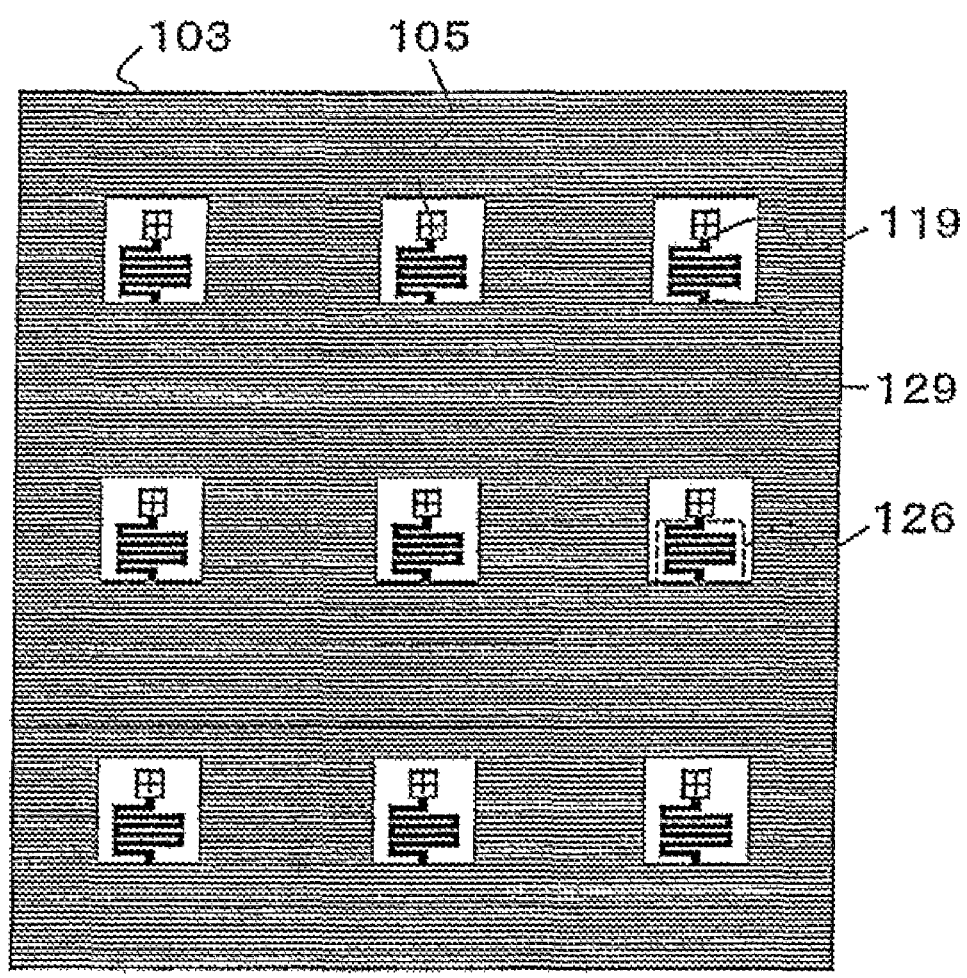
FIG. 12 A plan view showing the conductor plane layer when meander coils are used as planar inductance elements.

The example of FIGS. 9(b) and 10 has dealt with the case where the planar inductance elements 106 are made of the spiral coils 116. The planar inductance elements 106, however, may be other than the spiral coils 116. FIG. 12 is a plan view showing the layout of the layer of the conductor plane 103 when the planar inductance elements 106 are made of meander coils 126. The meander coils 126 may be used thus instead of the spiral coils 116. The spiral coils 116 or meander coils 126 can be used to increase the parallel inductance L.

Figure 13:
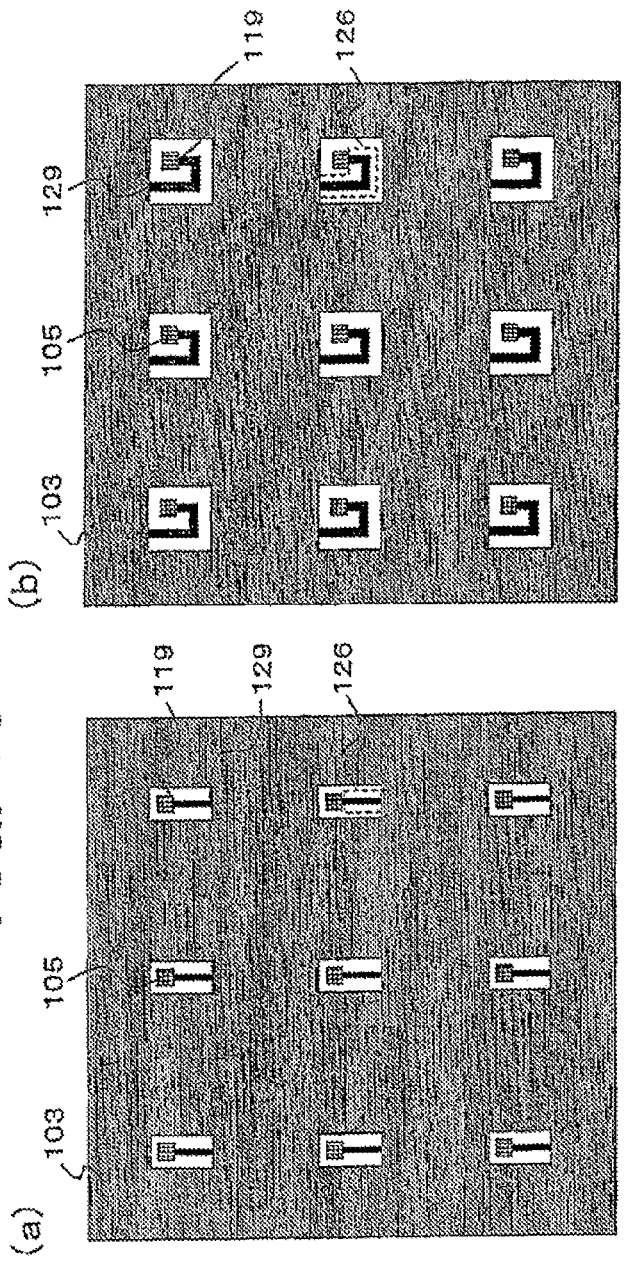
FIG. 13 Plan views showing a conductor plane layer when a linear conductor pattern other than spiral coils and meander coils is used as the planar inductance elements.

FIGS. 13(a) and 13(b) are plan views showing the conductor plane layer when a linear conductor pattern other than the spiral coils 116 and the meander coils 126 is used as the planar inductance elements 106. FIG. 13(a) shows an example where the planar inductance elements 106 are made of a straight conductor pattern. FIG. 13(b) shows an example where the planar inductance elements 106 are made of a broken line shape conductor pattern.

The openings 104 formed in the conductor plane 103 can be made smaller than the conductor pieces 102 in size so as to avoid an increase in the electrical resistance of the conductor plane 103. It should be noted that the EBG structure can be made by using a multilayer printed-circuit board or IPD manufacturing processes.

Second Embodiment

Figure 14:
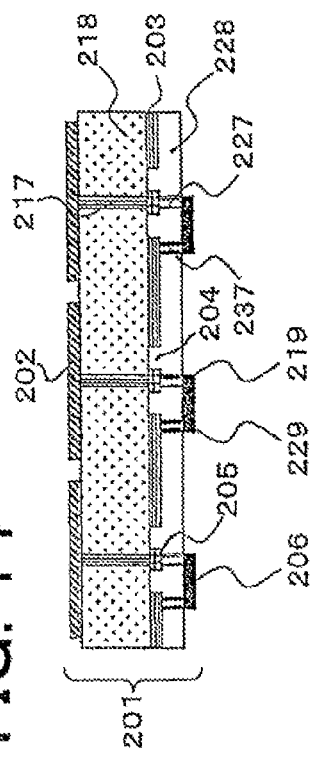
FIG. 14 A sectional view showing a second embodiment of the present invention.

FIG. 14 is a sectional view showing a second embodiment of the present invention. In the present embodiment, an EBG device 201 includes three conductor layers. The three conductor layers consist of a conductor layer that constitutes a periodic array of conductor pieces 202, a conductor layer of a conductor plane 203 in which openings 204 are periodically formed, and a conductor layer in which planar inductance elements 206 are formed.

A first dielectric plate 218 is interposed between the conductor layer that constitutes the periodic array of conductor pieces 202 and the conductor plane 203. A second dielectric plate 228 is interposed between the conductor plane 203 and the layer in which the planar inductance elements 206 are formed. The conductor plane 203 is formed in the layer between the conductor layer in which the conductor pieces 202 are formed and the conductor layer in which the planar inductance elements 206 are formed. Island electrodes 205 are arranged in the respective openings 204 of the conductor plane 203. The conductor plane 203 and the island electrodes 205 are formed in the same conductor layer.

Figure 15:
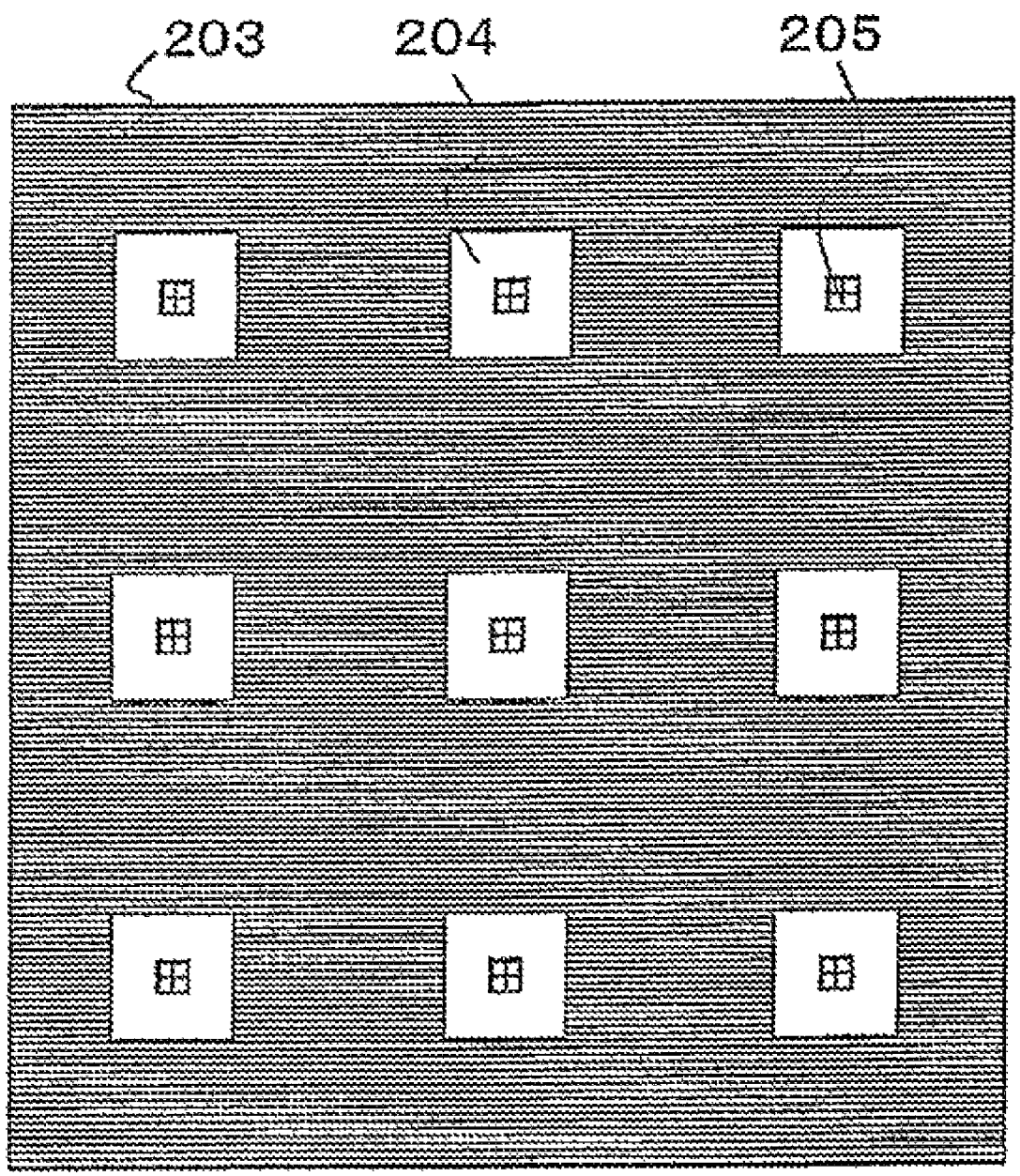
FIG. 15 A plan view showing the layout of the conductor plane layer of FIG. 14.

FIG. 15 is a plan view showing the layout of the conductor plane 203 that constitutes the EBG device of FIG. 14. Since the planar inductance elements 206 are formed in a layer different from the conductor plane 203, the layout includes no spiral coils 116 unlike the first embodiment shown in FIG. 9(b). The first and second dielectric plates 218 and 228 may be made of an epoxy resin substrate, ceramic substrate, or the like as in FIG. 7, or may be an air gap with no particular insert.

As shown in FIG. 14, each conductor piece 202 is electrically connected to the island electrode 205 by a first conductor post 217. The island electrode 205 is also electrically connected to a first terminal 219, one of two terminals of a planar inductance element 206 formed in the lowermost layer shown in FIG. 14, by a second conductor post 227. A second terminal 229, the other of the two terminals of the planar inductance element 206, is electrically connected to the conductor plane 203 by a third conductor post 237.

In the present embodiment, the planar inductance elements 206 are formed in the layer different from the conductor plane 203. In addition to the foregoing effects of the first embodiment, it is therefore possible, though with an increase in the number of conductor layers, to make the coils greater in size for higher parallel inductances L. The planar inductance elements 206 may be made of a linear pattern such as the spiral coils 116 and the meander coils 126.

The openings 204 formed in the conductor plane 203 can be made smaller than the conductor pieces 202 in size so as to avoid an increase in the electrical resistance of the conductor plane 203. It should be noted that the present embodiment can also be implemented by using a multilayer printed-circuit board or IPD manufacturing processes as with the first embodiment.

Third Embodiment

Figure 16:
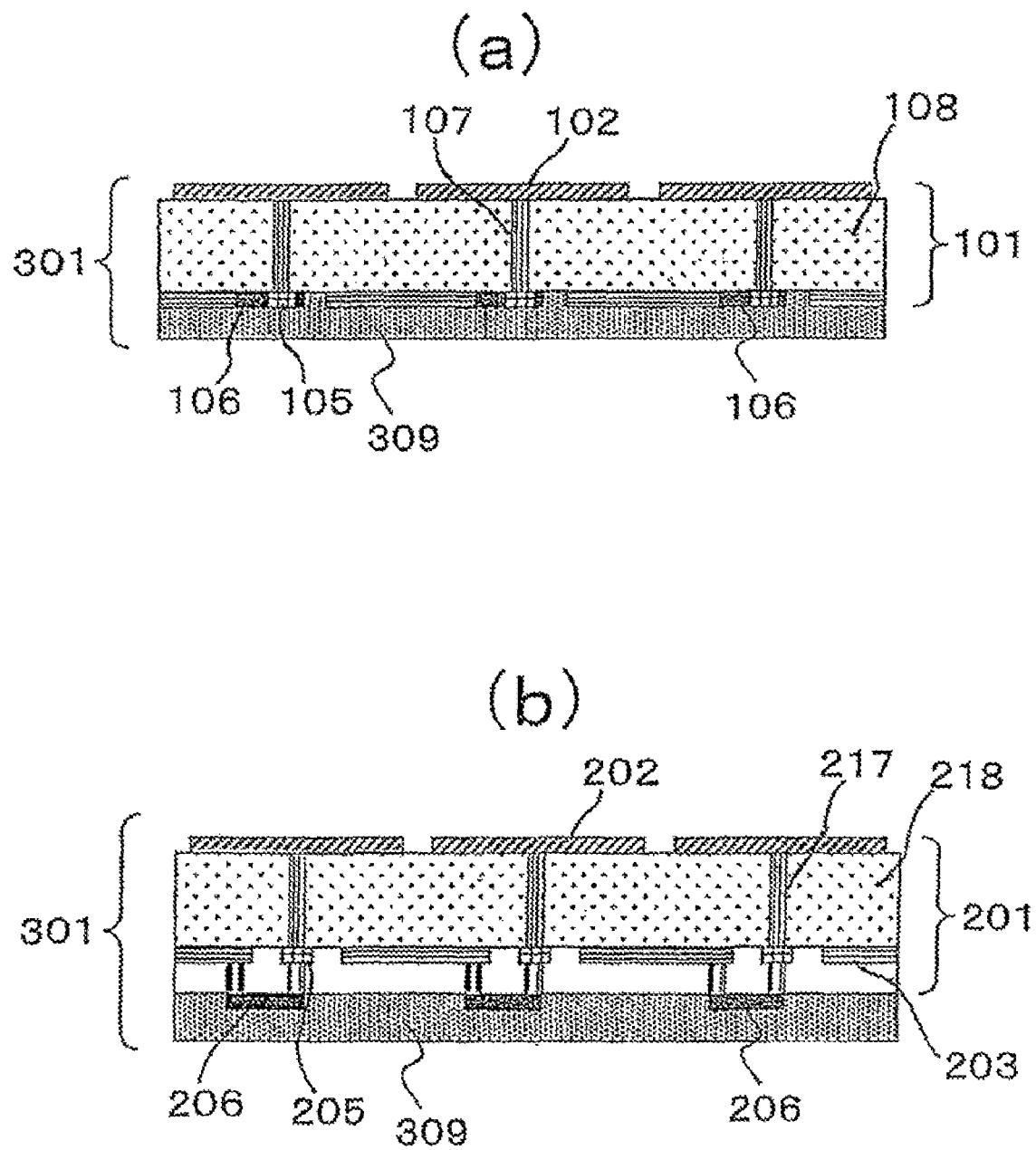
FIG. 16 Sectional views showing a third embodiment of the present invention.

As a structure for increasing the inductances of the planar inductance elements, the planar inductance elements may be covered with an insulating magnetic layer. FIGS. 16(a) and 16(b) show such a third embodiment of the present invention. FIG. 16(a) is a sectional view where the structure of covering the planar inductance elements with an insulating magnetic layer is applied to the embodiment of FIG. 1. In FIG. 16(a), the same parts as in FIG. 7 are designated by identical reference symbols.

FIG. 16(b) is a sectional view where the structure of covering the planar inductance elements with an insulating magnetic layer is applied to the embodiment of FIG. 14. In FIG. 16(b), the same parts as in FIG. 14 are designated by identical reference symbols.

In the structures according to the first embodiment of FIG. 7 and the second embodiment of FIG. 14, the planar inductance elements 106 and 206 can be formed in the surface conductor layer. As shown in FIG. 16(a), after the formation of the planar inductance elements 106 in the surface conductor layer, the formation of an insulating magnetic layer 309 that covers the planar inductance elements 106 by ferrite plating can be easily carried out. This makes it possible to form the insulating magnetic layer 309 with excellent high-frequency characteristics.

As shown in FIG. 16(b), after the formation of the planar inductance elements 206 in the surface conductor layer, the formation of an insulating magnetic layer 309 that covers the planar inductance elements 206 by ferrite plating can be easily carried out. It is therefore possible to form the insulating magnetic layer 309 with excellent high-frequency characteristics.

In the present embodiment, the planar inductance elements 106 and 206 are covered with the insulating magnetic layer 309, so that the planar inductance elements 106 and 206 increase in inductance. This allows a further increase in the parallel inductance L.

Fourth Embodiment

Figure 17:
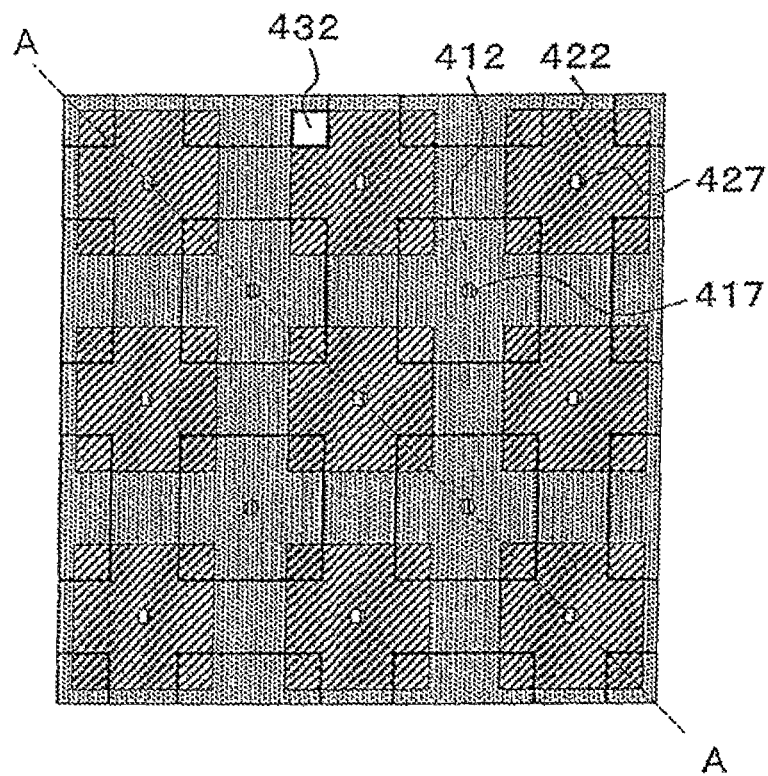
FIG. 17 A plan view showing a fourth embodiment of the present invention.
Figure 18:
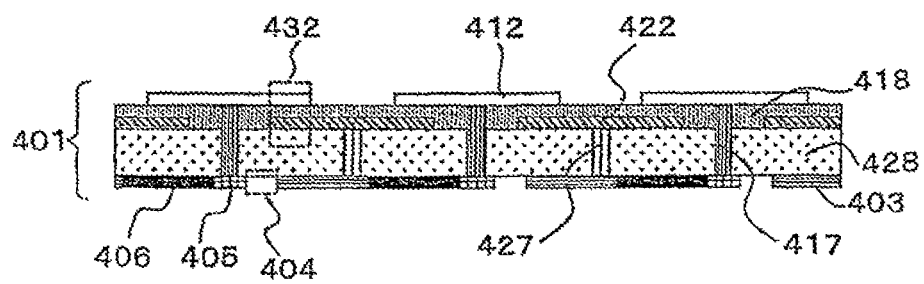
FIG. 18 A sectional view showing the cross section along the line A-A of FIG. 17.

The series capacitance C can be increased by a structure other than the interdigital structure shown in FIG. 11. FIG. 17 is a plan view showing a fourth embodiment of the present invention. FIG. 18 is a sectional view taken along the line A-A of FIG. 17.

As shown in FIG. 18, an EBG device 401 of the present embodiment has a periodic array of conductor pieces that includes two conductor layers with a first dielectric plate 418 therebetween. The conductor pieces will be referred to as first layer conductor pieces (to be first conductor pieces) 412 and second layer conductor pieces (to be second conductor pieces) 422 in order from the top of FIG. 18. As shown in FIG. 17, there are areas 432 where the first layer conductor pieces 412 and second layer conductor pieces 422 overlap each other. The overlapping areas 432 can be easily formed by periodically arraying the first layer conductor pieces 412 with one half period of offset both in horizontal and vertical directions from the periodic array of second layer conductor pieces 422.

When seen from above, in the overlapping areas 432, the first layer conductor pieces 412 and the second layer conductor pieces 422 are opposed to each other with the first dielectric plate 418 therebetween. In such a structure, capacitances occur between the first layer conductor pieces 412 and second layer conductor pieces 422 that adjoin each other in the overlapping areas. The areas of the overlapping areas 432 can be increased to increase the series capacitance C easily. It is therefore possible to reduce the first layer conductor pieces 412 and the second layer conductor pieces 422 in size while maintaining the value of the series capacitance C, so that the first layer conductor pieces 412 and the second layer conductor pieces 422 can be miniaturized.

In FIGS. 17 and 18, "403" designates a conductor plane, "404" designates an opening, "405" designates an island electrode, "406" designates a planar inductance element, "417" designates a first conductor post, "427" designates a second conductor post, and "428" designates a second dielectric plate. The first layer conductor pieces 412 are electrically connected to the island electrode 405 by the first conductor posts 417. The second layer conductor pieces 422 are electrically connected to the conductor plane 403 by the second conductor posts 427. The island electrodes 405 and the conductor plane 403 are connected through the planar inductance elements 406.

The electrical connections of the first layer conductor pieces 412 and the second layer conductor pieces 422 to the conductor plane 403 may be established reversely than in FIG. 18, such that the first layer conductor pieces 412 are electrically connected to the conductor plane 403 by the first conductor posts 417 and the second layer conductor pieces 422 are electrically connected to the island electrodes 405 by the second conductor posts 427. The first layer conductor pieces 412 and the second layer conductor pieces 422 both may be electrically connected to island electrodes 405 through the first conductor posts 417 and the second conductor posts 427, respectively. In either case, the island electrodes 405 and the conductor plane 403 are connected through the planar inductance elements 406.

Note that the series capacitance C may also be increased by making the first dielectric plate 418 from a high-permittivity material or by forming the first dielectric plate 418 in a small thickness. It will be understood that the first layer conductor pieces 412 and the second layer conductor pieces 422 constituting the EBG device 401 of the present embodiment are not limited to the square layout shown in FIG. 17, and may be a triangular lattice configuration by regular hexagons.

Fifth Embodiment

Figure 19:
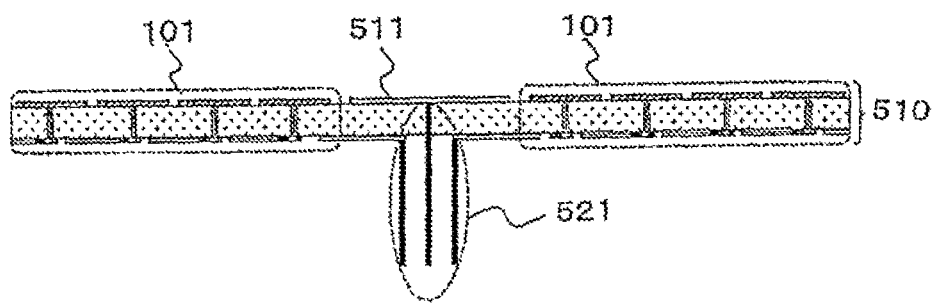
FIG. 19 A diagram showing an embodiment of a patch antenna that uses the EBG device of the present embodiment as its reflector.

The EBG device of the present invention may be used as an antenna reflector. FIG. 19 is a diagram showing an example of a patch antenna which uses the EBG device according to the first embodiment of the present invention as its reflector. The patch antenna 510 includes the reflector or EBG device 101, an antenna element 511, and feed lines 521.

The use frequency band of the patch antenna 510 is designed to fall within the band gap frequency band of the EBG device that is used as the reflector. Such a design prevents the propagation of surface waves through the EBG device 101, whereby backside emission can be suppressed to avoid degradation of antenna characteristics. The EBG device of the first embodiment may also be used as the reflectors of antennas other than the patch antenna.

Figure 20:
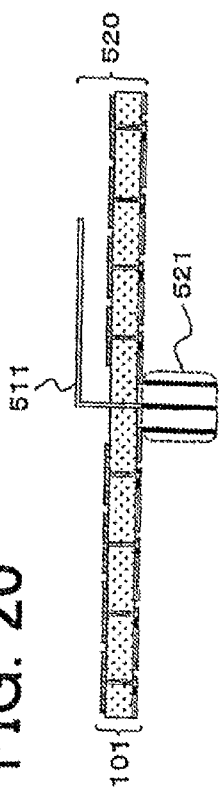
FIG. 20 A sectional view showing an embodiment of an inverted L antenna that uses the EBG device of the present embodiment as its reflector.

FIG. 20 is a diagram showing an example of an inverted L antenna that uses the EBG device according to the first embodiment of the present invention as its reflector. Like the patch antenna 510, the inverted L antenna 520 includes the reflector or EBG device 101, an antenna element 511, and feed lines 521. The use frequency band of the inverted L antenna 520 is designed to fall within the band gap frequency band of the EBG device that is used as the reflector. Such a design prevents the propagation of surface waves through the EBG device 101, whereby backside emission can be suppressed to avoid degradation of antenna characteristics as with the patch antenna 510.

With the inverted L antenna 520, the electromagnetic waves make in-phase reflection on the reflector of the EBG device 101, which improves the radiation efficiency. In addition, the antenna element 511 can be located close to the surface of the EBG device 101, so that the entire inverted L antenna 520 can be reduced in thickness.

It should be appreciated that while the antenna embodiments described in conjunction with FIGS. 19 and 20 use the EBG device 101 of the first embodiment of the present invention as the reflector, the EBG devices according to the second to fourth embodiments of the present invention may be used instead.

Sixth Embodiment

Figure 21:
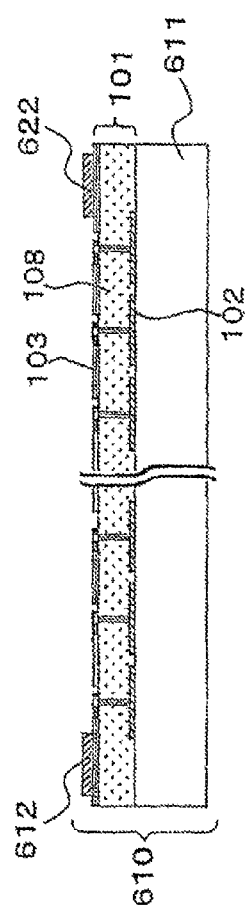
FIG. 21 A sectional view showing an embodiment of a chip part type common mode filter that uses the EBG device of the present embodiment.

The EBG device of the present invention may be used to constitute a common mode filter. FIG. 21 is a diagram showing an example of such a common mode filter of chip part type which uses the EBG device according to the first embodiment of the present invention. In the chip part type common mode filter 610 shown in FIG. 21, the EBG device 101, which functions as a common mode filter, is formed on a substrate 611. In terms of layer configuration, the EBG device 101 is reverse to the sectional view of FIG. 7, having the layer constituting the conductor pieces 102 and the layer of the conductor plane 103 in this order from the bottom.

The substrate 611 is intended to mechanically reinforce the EBG device 101 if the EBG device 101 has a thickness of, e.g., 100 micrometer or less. Two pads 612 and 622 are formed on two locations at the respective ends of the conductor plane 103. The pads 612 and 622 are electrically connected to the conductor parts of the EBG device 101.

The conductor layers may have a layer configuration reverse to that of the example of FIG. 21 so that the conductor plane 103 and the layer constituting the conductor pieces 102 are formed on the substrate 611 in this order from the bottom. In such a case, the two pads 612 and 622 can be formed on two locations on the conductor pieces 102 at the respective ends of the EBG device 101 so that the pads 612 and 622 are electrically connected to the conductor parts of the EBG device 101.

The chip part type common mode filter 610 according to the present embodiment may be fabricated, for example, by using IPD manufacturing processes with a glass substrate or the like as the substrate 611. More specifically, the common mode filter 610 can be made by depositing conductors and dielectrics that constitute the EBG device 101 and the pads 612 and 622 on the substrate 611.

It should be appreciated that while the EBG device 101 of the first embodiment is used as the EBG device that functions as a common mode filter in the example of FIG. 21, the EBG structures according to the second to fourth embodiments of the present invention may be used instead.

Figure 22:
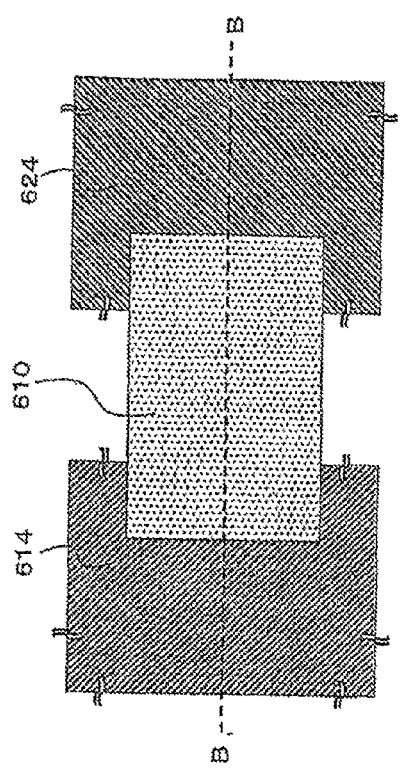
FIG. 22 A plan view showing an example where the chip part type common mode filter of the present embodiment is mounted on a PCB.

FIGS. 22 and 23 are diagrams showing an example where the chip part type common mode filter 610 according to the present embodiment is mounted on a PCB (Printed-Circuit Board) 613. FIG. 22 shows a plan view, and FIG. 23 a sectional view taken along the line B-B of FIG. 22. In the configuration example shown in FIGS. 22 and 23, the PCB 613 includes two separate ground patterns, or a first ground pattern 614 and a second ground pattern 624. The first ground pattern 614 and the second ground pattern 624 are electrically connected to pads 616 on the PCB 613 through vias 615. The first and second ground patterns constitute a ground layer 604 in the PCB 613.

Here, the pads 616 on the PCB 613 are electrically connected to the first pad 612 and the second pad 622 of the chip part type common mode filter 610 shown in FIG. 21 (not shown in FIG. 22 or 23), respectively, by soldering or the like. Consequently, the chip part type common mode filter 610 is electrically connected between the first ground pattern 614 and the second ground pattern 624 in the PCB 613.

The electrical connection of the two separate ground patterns in the PCB 613 through the chip part type common mode filter 610 according to the embodiment shown in FIG. 21 can suppress the propagation of a common mode current from one ground pattern to the other.

Seventh Embodiment

The EBG device of the present invention may be provided inside a PCB so that a common mode filter is built in the PCB. FIG. 24 is a plan view showing an example of a PCB 713 that has a built-in common mode filter 710 which is composed of the EBG device according to the first embodiment of the present invention. FIG. 25 is a sectional view taken along the line C-C of FIG. 24.

The PCB 713 shown in FIG. 24 includes: two ground patterns, or a first ground pattern 714 and a second ground pattern 724; the common mode filter 710 which is composed of the EBG device 101; a device 715 to be a noise source; and a device 725 which is susceptible to noise.

A ground terminal of the device 715 to be the noise source is electrically connected to the first ground pattern 714. A ground terminal of the noise-susceptible device 725 is electrically connected to the second ground pattern 724. The first ground pattern 714 and the second ground pattern 724 are electrically connected through the common mode filter 710.

FIG. 25 is a sectional view showing the connections. The conductor plane 103 of the EBG device 101 is arranged in a ground layer 704 in the PCB 713 where the first ground pattern 714 and the second ground pattern 724 are formed. The periodic array of conductor pieces 102 is arranged in a layer different from the ground layer 704 in the PCB 713 (see FIG. 7), whereby the EBG device 101 can be formed in the PCB 713.

Here, the first ground pattern 714, the second ground pattern 724, and the conductor plane 103 of the EBG device 101 are formed in the ground layer 704 as a continuous pattern. With such a configuration, the first ground pattern 714 and the second ground pattern 724 can be electrically connected through the common mode filter 710 without the provision of an additional conductor layer intended for the conductor plane 103 of the EBG device 101.

The structure shown in FIG. 25 can suppress the propagation of a common mode current from the first ground pattern 714 on the side of the noise-source device 715 to the second ground pattern 724 without using a filter part. It is therefore possible to suppress the effect of a common mode current on the noise-susceptible device 725.

While FIG. 24 shows an example where the common mode filter 710 is built in the PCB 713 for the purpose of protecting the noise-susceptible device 724 from a common mode current, the common mode filter 710 may be used to suppress common mode radiation from a cable that is connected to the PCB 713.

Figure 26:
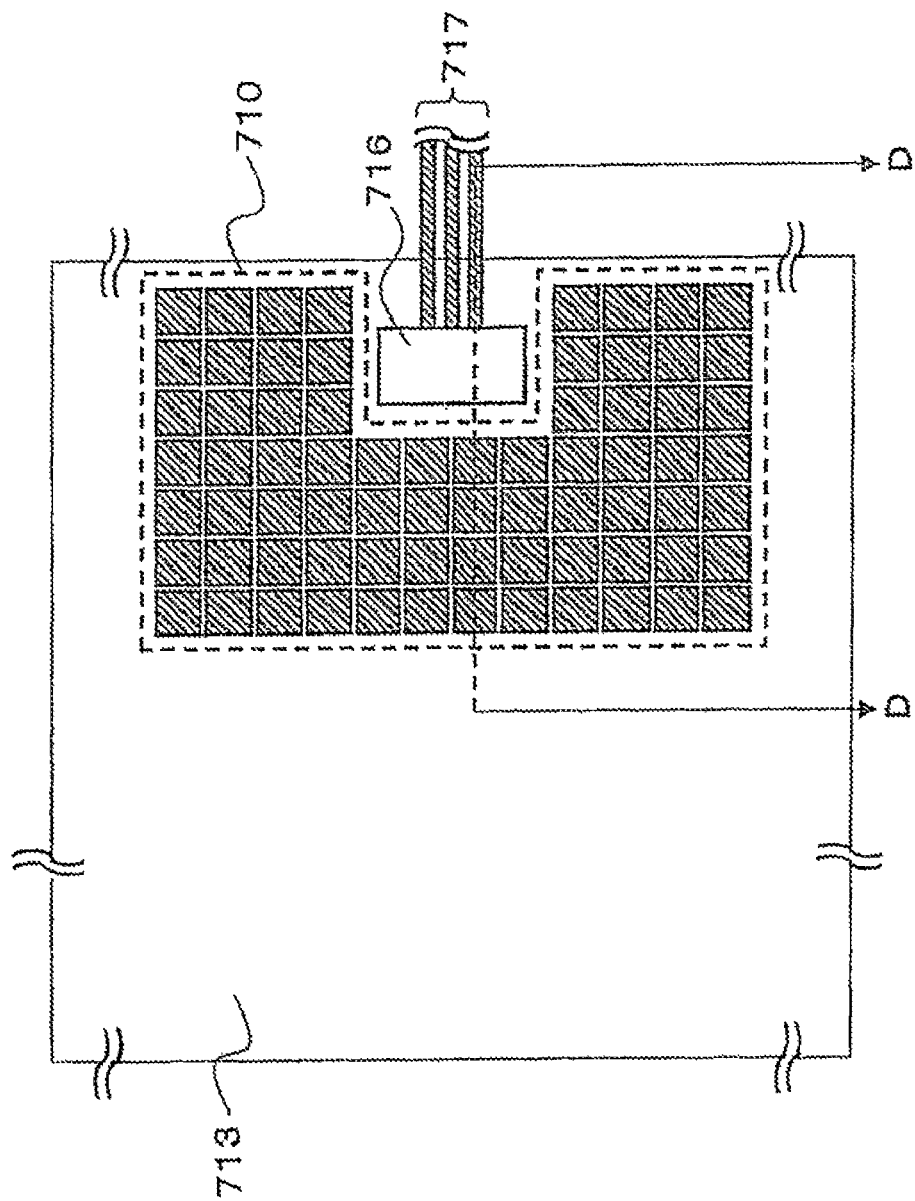
FIG. 26 A plan view showing another example of the PCB that has a built-in common mode filter 710 according to the present invention.
Figure 27:
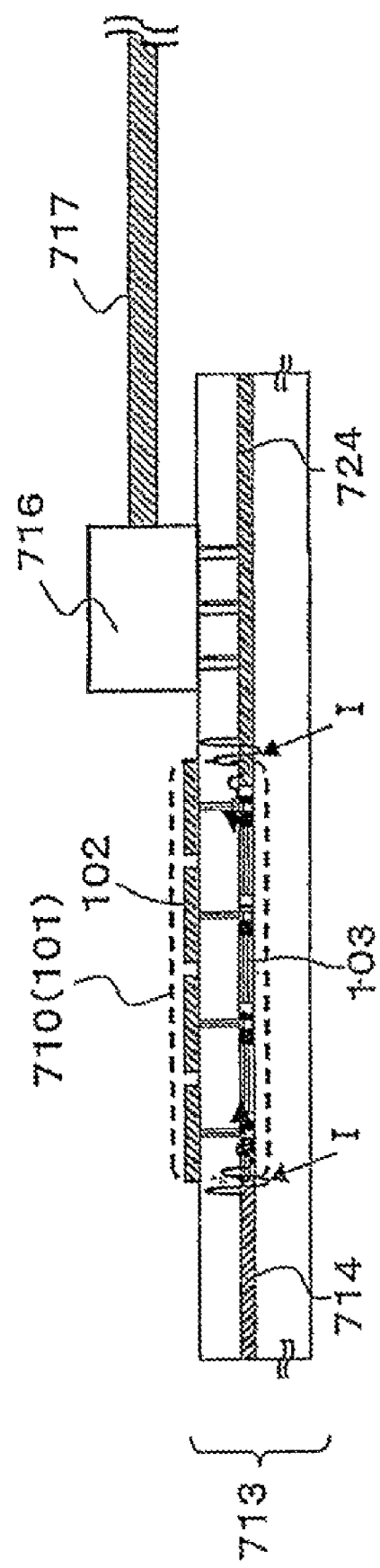
FIG. 27 A sectional view showing the cross section along the line D-D of FIG. 26.

FIG. 26 is a plan view showing another example of the PCB 713 that has a built-in common mode filter 710 which is composed of the EBG device according to the first embodiment of the present invention. FIG. 27 is a sectional view taken along the line D-D of FIG. 26.

As shown in FIG. 26, the common mode filter 710 composed of the EBG device of the present embodiment is arranged in the peripheral area of a connector 716 on the PCB 713 to which cables 717 are connected so as to surround the connector 716. The connector 716 on the PCB 713 is electrically connected to the second ground pattern 724 of the PCB 713. When the cables 717 are connected to the connector 716, the ground of the cables 717 is thus electrically connected to the second ground pattern 724.

Now, suppose that there is no common mode filter 710, and the first ground pattern 714 and second ground pattern 724 constitute a continuous conductor plane in FIG. 27. In such a case, a common mode current I occurring in the PCB 713 flows through the continuous conductor plane and propagates to the cables 717 through the connector 716.

In contrast, when the EBG device 101 having a band gap in a desired frequency band is arranged in the peripheral area of the connector 716 as shown in FIG. 26, the common mode current I flowing through the first ground pattern 714 is suppressed not to propagate to the connector 716 and is thus suppressed not to propagate to the cables 717. Consequently, it is possible to suppress the occurrence of unwanted electromagnetic waves from the cables 717.

Even if a common mode current I flows through the ground of the cables 717 due to unwanted external electromagnetic waves, the EBG device 101 can also suppress the propagation of the common mode current I from the connector 716 to the side of the first ground pattern 714. It is therefore possible to suppress the effect of the common mode current I on the circuit operation characteristics inside the PCB 713.

It should be appreciated that while the EBG device 101 of the first embodiment is used as the common mode filter 710 in the examples of FIGS. 24 and 25 and FIGS. 26 and 27, the EBG devices according to the second to fourth embodiments of the present invention may be used instead.

Eighth Embodiment

Figure 28:
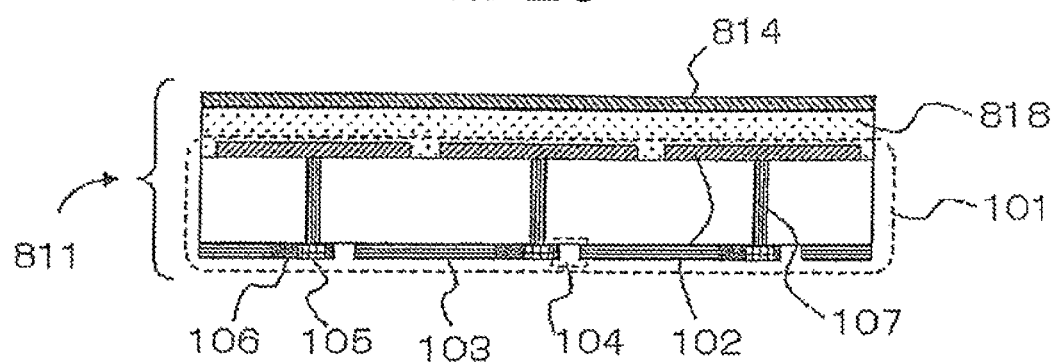
FIG. 28 A sectional view showing a parallel-plate waveguide type EBG device according to an eighth embodiment of the present invention.

The EBG device of the present invention may be used to constitute an EBG device of parallel-plate waveguide type. FIG. 28 is a sectional view showing an example of such a parallel-plate waveguide type EBG device which uses the EBG device according to the first embodiment of the present invention. The parallel-plate waveguide type EBG device 811 includes a first conductor plane 814, a first dielectric plate 818, and the EBG device 101 of FIG. 7.

The periodic array of conductor pieces 102 of the EBG device 101 is arranged in a conductor layer between the first conductor plane 814 and the conductor plane 103 of the EBG device 101. Conductor posts 107 which electrically connect the respective conductor pieces 102 to the conductor plane 103 of the EBG device 101 are made of interlayer vias. It should be appreciated that while the EBG device 101 of the first embodiment is used as the EBG device here, the EBG devices according to the second to fourth embodiments may be used instead.

Figure 29:
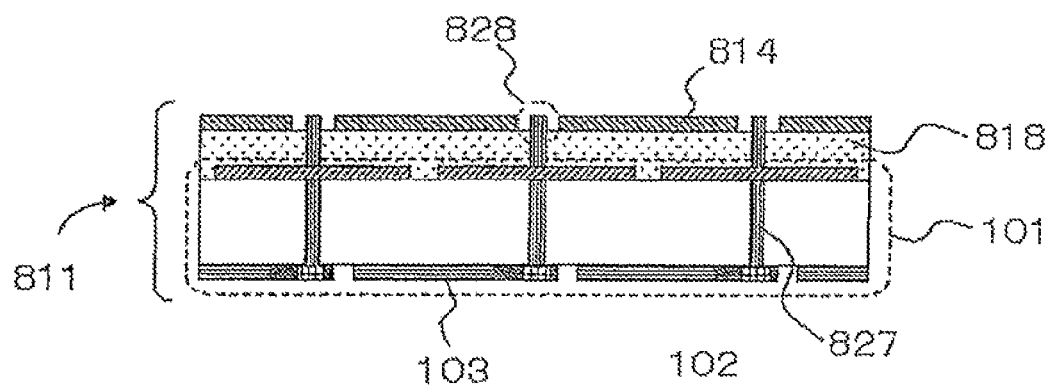
FIG. 29 A sectional view showing the parallel-plate waveguide type EBG device according to the eighth embodiment of the present invention where through vias are used as the conductor posts.

Through vias may be used as the conductor posts of the EBG device that is a component of the parallel-plate waveguide type EBG device 810. FIG. 29 shows an example of the parallel-plate waveguide type EBG device that includes the EBG device 101 of the first embodiment where through vias 827 are used as the conductor posts. It should be appreciated that while the EBG device 101 of the first embodiment is used as the EBG device here, the EBG devices according to the second to fourth embodiments may be used instead. In FIG. 29, the first conductor plane 814 has clearances 828 where the vias penetrate through, whereby the EBG device 101 and the first conductor plane 814 can be electrically isolated from each other. Consequently, the first conductor plane 814 and the conductor plane 103 can be electrically isolated from each other.

In addition, the capacitance C1 can be increased by making the first dielectric plate 818 from a high-permittivity material or by forming the first dielectric plate 818 in a small thickness. It will be understood that the conductor pieces 112 constituting the parallel-plate waveguide type EBG device 810 of the present embodiment are not limited to the square layout shown in FIG. 9(b), and may be regular hexagons in a triangular lattice configuration etc.

Ninth Embodiment

Figure 30:
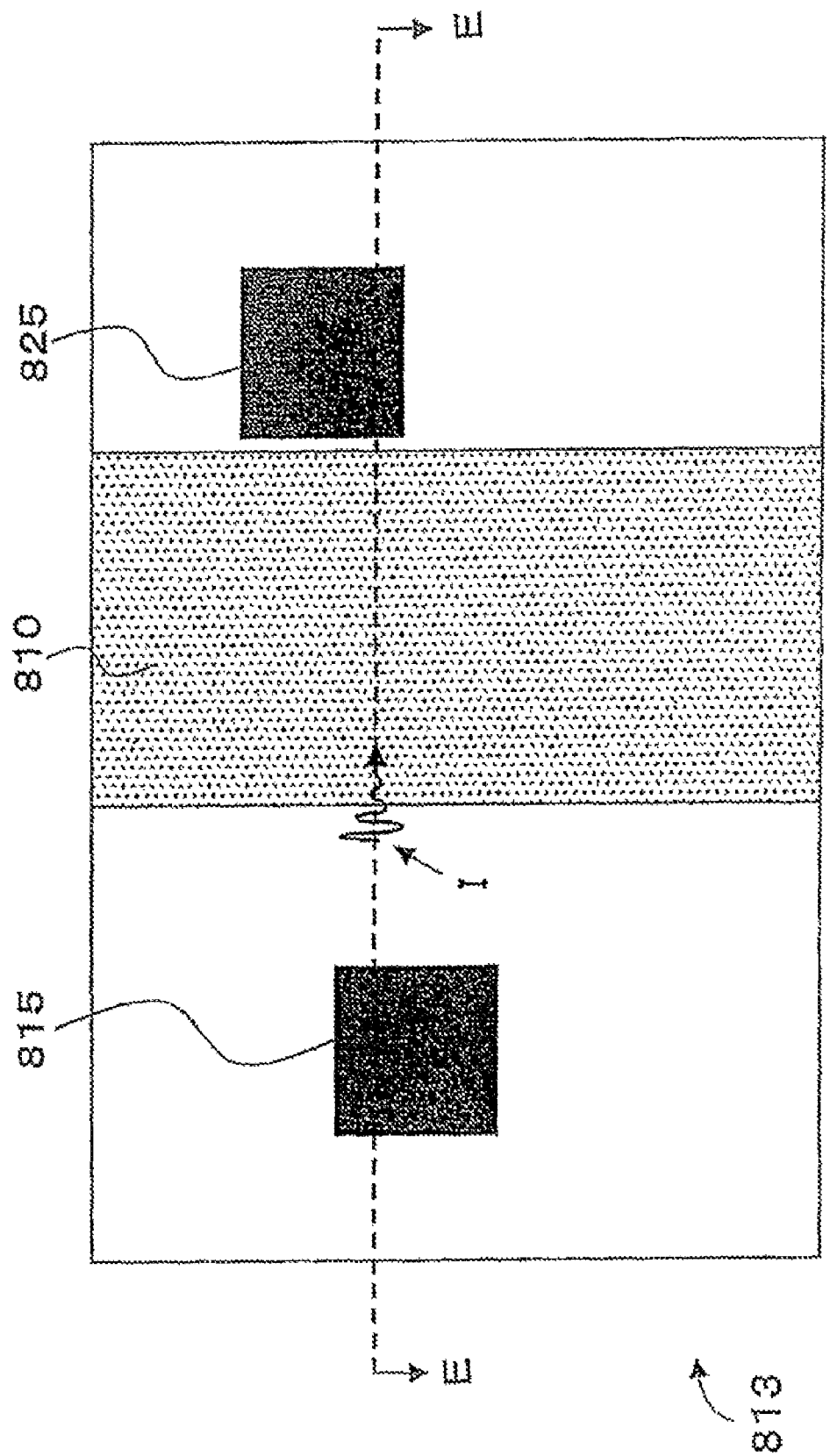
FIG. 30 A plan view showing an example of a PCB that has a built-in power supply noise suppression filter which includes the EBG device of the present embodiment.
Figure 31:
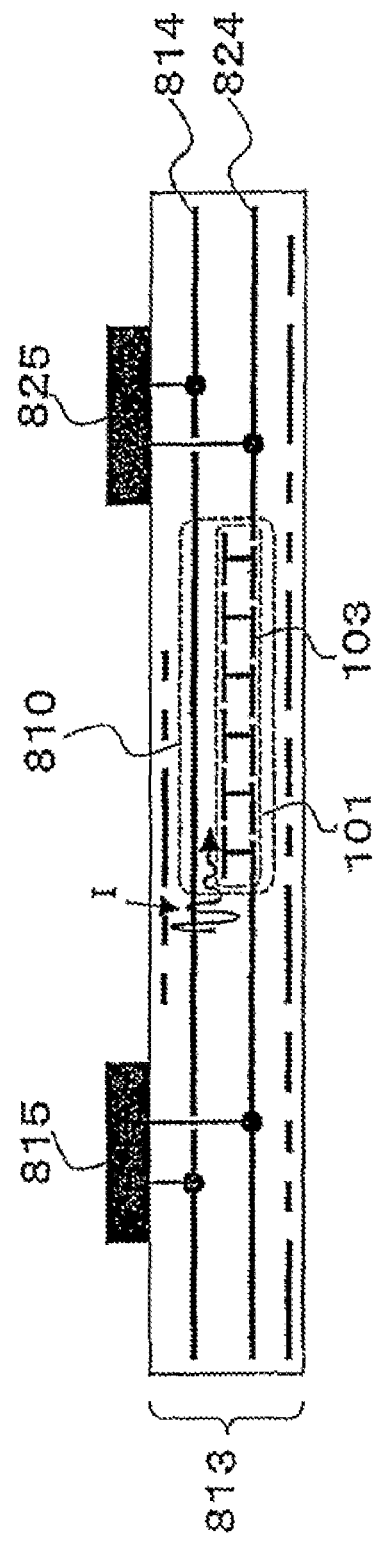
FIG. 31 A sectional view showing the cross section along the line E-E of FIG. 30.

The parallel-plate waveguide type EBG device of the present invention may be used to constitute a power supply noise suppression filter. FIGS. 30 and 31 show an example of a PCB that incorporates such a power supply noise suppression filter which is composed of the parallel-plate waveguide type EBG device according to the eighth embodiment of the present invention. FIG. 30 is a plan view, and FIG. 31 is a sectional view taken along the line E-E of FIG. 30.

As shown in FIG. 31, either one of the first conductor plane 814 and the second conductor plane 824 in the PCB 813 serves as a power supply layer, and the other a ground layer. A noise-source device 815 and a noise-susceptible device 825 are mounted on the PCB 813. Both the devices are electrically connected to the power supply layer and the ground layer. The power supply noise suppression filter 810 is arranged in part of the area between the power supply and ground layers in the PCB 811

The power supply noise suppression filter 810 is composed of the parallel-plate waveguide type EBG device 811 of FIG. 28. The parallel-plate waveguide type EBG device 811 includes the first conductor plane 814 and the EBG device 101 of FIG. 7. The conductor plane 103 of the EBG device 101 is formed in part of the layer of the second conductor plane 824 in the PCB 813. The periodic array of conductor pieces 102 of the EBG device 101 is arranged in a conductor layer between the first conductor plane 814 and the second conductor plane 824. The conductor posts 107 which electrically connect the respective conductor pieces 102 to the conductor plane 103 of the EBG device 101 are made of interlayer vias.

While in the example shown in FIG. 31 the conductor plane 103 of the EBG device 101 is formed in the second conductor plane 824 which is the lower conductor plane layer, the conductor plane 103 of the EBG device 101 may be formed in the first conductor plane 814 which is the upper conductor plane layer.

As shown in FIGS. 30 and 31, the power supply noise suppression filter 810 is arranged in such a layout that both the first conductor plane 814 and the second conductor plane 824 are separated into the side of the noise-source device 815 and the side of the noise-susceptible device 825 by the power supply noise suppression filter 810.

Such an arrangement of the power supply noise suppression filter 810 can suppress power supply noise that propagates from the noise-source device 815 to between the power supply and ground layers which are composed of the first conductor plane 814 and the second conductor plane 824. This makes it possible to suppress malfunction of the noise-susceptible device 825 and unwanted electromagnetic radiation from the PCB 813.

While in the example of FIGS. 30 and 31 the power supply noise suppression filter 810 is arranged in part of the area between the power supply and ground layers, the power supply noise suppression filter 810 may be laid out over the entire first conductor plane 814 and second conductor plane 824. Even in such a case, like the example of FIGS. 30 and 31, it is possible to suppress the power supply noise that propagates from the noise-source device 815 to between the power supply and ground layers which are composed of the first conductor plane 814 and the second conductor plane 824. Malfunction of the noise-susceptible device 825 and unwanted electromagnetic radiation from the PCB 813 can thus be suppressed.

FIG. 32 is a sectional view showing another example of the PCB that has a built-in power supply noise suppression filter 810. A noise-source device 815 or a noise-susceptible device 825 is mounted on the PCB 813, in which the power supply noise suppression filter 810 is arranged in the peripheral area of the parallel plates that are composed of the first conductor plane 814 and the second conductor plane 824. Surrounding the side of the noise-source device 815 with the power supply noise suppression filter 810 can suppress unwanted electromagnetic radiation from the PCB 813 to outside. Surrounding the noise-susceptible device 825 with the power supply noise suppression filter 810 can suppress the propagation of power supply noise into the PCB 813 due to unwanted electromagnetic radiation from outside.

The power supply noise suppression filter including the EBG device of the present invention may be formed inside an interposer of a semiconductor package. FIG. 33 is a sectional view showing an example of such an interposer 823 which has a built-in power supply noise suppression filter including the EBG device of the present invention.

As shown in FIG. 33, either one of a first conductor plane 814 and a second conductor plane 824 of the interposer 823 serves as a power supply layer, and the other a ground layer. A semiconductor chip 835 is mounted on the interposer 823, and is electrically connected to the power supply layer and the ground layer. The power supply noise suppression filter 810 has the same layer configuration as that of the PCB 813 where the power supply noise suppression filter shown in FIGS. 30 and 31 is built in. The power supply noise suppression filter 810 is formed over the entire area between the power supply and ground layers of the interposer 823.

Such a configuration can suppress power supply noise that propagates from the semiconductor chip 835 to between the power supply and ground layers composed of the first conductor plane 814 and the second conductor plane 824. It is therefore possible to suppress the propagation of power supply noise to an external circuit that is electrically connected to the interposer 823 through BGAs 816.

In the meantime, power supply noise that propagates from an external circuit to the interposer 823 through the BGAs 816 is suppressed by the power supply noise suppression filter 810 in the interposer 823 so as not to propagate to the semiconductor chip 835. It is therefore possible to suppress malfunction of the semiconductor chip 835 due to the power supply noise.

Figure 34:
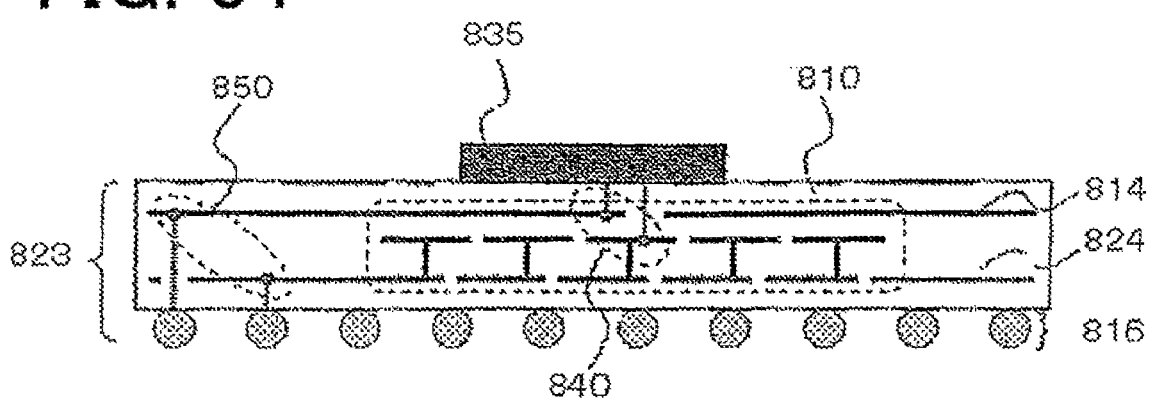
FIG. 34 A sectional view showing an example where the power supply noise suppression filter 810 is formed in part of the area between power supply and ground layers.
Figure 35:
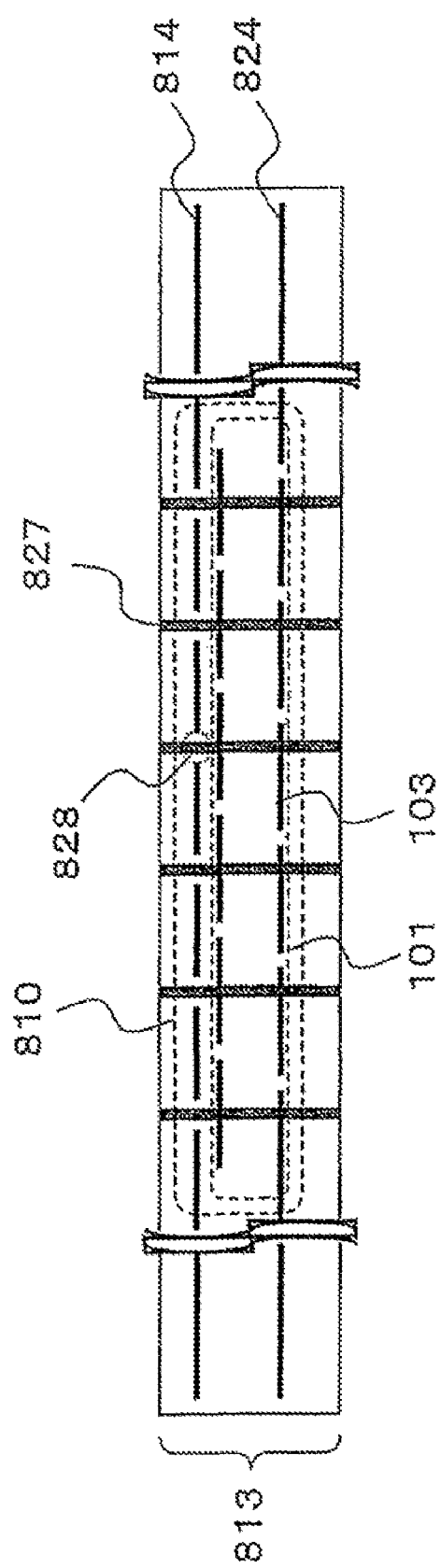
FIG. 35 A sectional view showing an example of a PCB that has a built-in power supply noise suppression filter which includes the EBG device of the present embodiment where through vias are used as the conductor posts.

In the example of FIG. 33, the power supply noise suppression filter 810 is formed over the entire area between the power supply and ground layers of the interposer 823. With a PCB, the power supply noise suppression filter 810 may be formed in part of the area between the power supply and ground layers. FIG. 34 shows an example where the power supply noise suppression filter 810 is formed in part of the area between the power supply and ground layers. In FIG. 34, the power supply noise suppression filter 810 is arranged between the connection 840 in the interposer 823 where the power supply and ground layers are connected to the semiconductor chip 835 and the connection 850 in the interposer 823 where the power supply and ground layers are connected to an external circuit. The power supply noise suppression filter 810 in the interposer 823 can thus suppress the propagation of electromagnetic waves between the semiconductor chip 835 and the external circuit.

In the examples of FIGS. 30 and 31 and FIG. 33, the EBG device 101 of the first embodiment is used as the EBG device that is used as a component of the power supply noise suppression filter 810. However, the EBG devices according to the second to fourth embodiments may be used instead.

The power supply noise suppression filter 810 may be made of a parallel-plate waveguide type EBG device such as shown in FIG. 29, using through vias 827 as the conductor posts. FIG. 34 shows an example of a PCB that has a built-in power supply noise suppression filter including the EBG device 101 of the first embodiment where through vias 827 are used as the conductor posts. It should be appreciated that while the EBG device 101 of the first embodiment is used as the EBG device here, the EBG devices according to the second to fourth embodiments may be used instead. In FIG. 34, the first conductor plane 814 has clearances 828 where the vias penetrate through, whereby the EBG device 101 and the first conductor plane 814 can be electrically isolated from each other. This makes it possible to use either one of the first conductor plane 814 and the second conductor plane 824 as a power supply layer, and the other as a ground layer.

The foregoing embodiments have dealt with the cases where the conductor pieces of the EBG device, the openings in the conductor plane, parallel type inductance elements, and the like are periodically arrayed in two dimensions. However, the present invention is not limited thereto, and can provide the same effects even with a one-dimensional periodic array.

Up to this point, representative embodiments of the present invention have been described. However, the present invention may be carried out in various other forms without departing from its spirit or essential characteristics set forth by the appended claims. The foregoing embodiments are therefore to be considered as mere illustrative and not restrictive. The scope of the invention is given by the appended claims, and is not restricted by the foregoing description or abstract.

All changes and modifications which come within the meaning and range of equivalency of the claims are intended to be embraced within the scope of the present invention.

REFERENCE SIGNS LIST

1: HIS
2, 102, 202: conductor piece
3, 103, 203, 403: conductor plane
4: conductor element
6: inductance element
7: conductor post
8, 108: dielectric plate
9: unit cell
11, 811: parallel-plate waveguide type EBG structure
12: series resonant circuit
15: junction between an inductance element 6 and a first conductor post 17
16, 116: spiral coil
17, 217, 417: first conductor post
18, 118, 218, 418, 818: first dielectric plate
25: junction between an inductance element 6 and a second conductor post 27
26, 126: meander coil
27, 227, 427: second conductor post
28, 128, 228, 428: second dielectric plate
101, 201, 301, 401: EBG device
104, 204, 404: opening
105, 205, 405: island electrode
106, 206, 406: planar inductance element
107: conductor post
117: non-through via
119, 219, 419: first terminal of a planar inductance element
127, 827: through via
129, 229, 429: second terminal of a planar inductance element
130: gap area
237: third conductor post
309: insulating magnetic layer
412: first layer conductor piece
422: second layer conductor piece
432: overlapping area
510: patch antenna
511: antenna element
520: inverted L antenna
521: feed line
604, 704: ground layer
610: common mode filter
611: substrate
612: first pad
622: second pad
613, 713, 813: PCB
614, 714: first ground pattern
615: via
616: pad on a PCB
624, 724: second ground pattern
710: common mode filter
715, 815: device to be a noise source
716: connector
717: cable
725, 825: noise-susceptible device
810: power supply noise suppression filter
814: first conductor plane
816: BGA
823: interposer
824: second conductor plane
828: clearance
835: semiconductor chip
840: connection where power supply and ground layers inside the interposer 823 are connected to the semiconductor chip 835
850: connection where the power supply and ground layers inside the interposer 823 are connected to an external circuit

The invention claimed is:

1. An electromagnetic band gap device comprising: conductor pieces that are periodically arrayed; a conductor plane that has openings periodically arrayed so as to correspond to the conductor pieces; island electrodes that are arranged in the openings of the conductor plane; and inductance elements,
the conductor pieces and the island electrodes being electrically connected by conductor posts, the island electrodes and the conductor plane being connected through the inductance elements.

2. The electromagnetic band gap device according to claim 1, wherein the size of each of the openings are smaller than that of each of the conductor pieces.

3. The electromagnetic band gap device according to claim 1, wherein: the inductance elements are formed in the openings of the conductor plane; and either one of terminals of each of the inductance elements is connected to the conductor plane, and the other terminal is connected to each of the island electrodes.

4. The electromagnetic band gap device according to claim 1, wherein: the inductance elements are formed in a layer different from the conductor plane; and either one of terminals of each of the inductance elements is electrically connected to each of the island electrodes by a conductor post, and the other terminal is electrically connected to the conductor plane by a conductor post.

5. The electromagnetic band gap device according to claim 1, wherein the inductance elements are spiral coils.

6. The electromagnetic band gap device according to claim 1, wherein the inductance elements are meander coils.

7. The electromagnetic band gap device according to claim 1, wherein an insulating magnetic layer is arranged next to a conductor layer in which the inductance elements are formed.

8. The electromagnetic band gap device according to claim 1, wherein the conductor pieces form an interdigital structure in which adjoining sides interdigitate with each other.

9. The electromagnetic band gap device according to claim 1, wherein the periodic array of conductor pieces includes a first layer of first conductor pieces and a second layer of second conductor pieces, with overlapping areas where the first conductor pieces and the second conductor pieces overlap each other.

10. An antenna comprising the electromagnetic band gap device according to claim 1 as a reflector, a use frequency band of the antenna falling within a band gap frequency band of the electromagnetic band gap device.

11. The antenna according to claim 10, wherein the antenna is a patch antenna.

12. The antenna according to claim 10, wherein the antenna is an inverted F antenna.

13. A common mode filter comprising the electromagnetic band gap device according to claim 1.

14. A parallel-plate waveguide type electromagnetic band gap device comprising: the electromagnetic band gap device according to claim 1; and a first conductor plane, the first conductor plane and the electromagnetic band gap device being electrically insulated from each other, the periodic array of conductor pieces that constitute the electromagnetic band gap device being arranged in a layer between the first conductor plane and the conductor plane that constitutes the electromagnetic band gap device.

15. A power supply noise suppression filter comprising: the parallel-plate waveguide type electromagnetic band gap device according to claim 14; and parallel plates that are composed of first and second conductor planes, all or part of the parallel plates being formed as the parallel-plate waveguide type electromagnetic band gap device, either one of the first and second conductor planes being connected to a power supply, the other being grounded.

16. The electromagnetic band gap device according to claim 1, wherein each of the inductance elements is plane type.

17. The electromagnetic band gap device according claim 3, wherein each of the inductance elements is plane type, and the inductance elements and the island electrodes are formed as a conductor pattern continuous with the same conductor layer as the conductor plane to which the openings are formed.

18. The electromagnetic band gap device according claim 4, wherein each of the inductance elements is plane type, and a conductor layer to which the inductance elements of the plane type is formed is arranged at a reverse side to a placement side of a conductor layer to which the conductor pieces are formed, about the conductor plane.

* * * * *